US012500068B2

(12) United States Patent
Sanchez et al.

(10) Patent No.: US 12,500,068 B2
(45) Date of Patent: *Dec. 16, 2025

(54) EDGE RINGS PROVIDING KINEMATIC COUPLING AND CORRESPONDING SUBSTRATE PROCESSING SYSTEMS

(71) Applicant: Lam Research Corporation, Fremont, CA (US)

(72) Inventors: Alejandro Sanchez, Mountain View, CA (US); Grayson Ford, San Jose, CA (US); Darrell Ehrlich, San Jose, CA (US); Aravind Alwan, Milpitas, CA (US); Kevin Leung, Dublin, CA (US); Anthony Contreras, Stockton, CA (US); Zhumin Han, Fremont, CA (US); Raphael Casaes, Alameda, CA (US); Joanna Wu, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/377,141

(22) Filed: Oct. 5, 2023

(65) Prior Publication Data
US 2024/0038504 A1 Feb. 1, 2024

Related U.S. Application Data

(63) Continuation of application No. 16/960,818, filed as application No. PCT/US2018/050273 on Sep. 10, 2018, now Pat. No. 11,798,789.
(Continued)

(51) Int. Cl.
*H01J 37/32* (2006.01)
*H01L 21/67* (2006.01)
*H01L 21/687* (2006.01)

(52) U.S. Cl.
CPC .. *H01J 37/32642* (2013.01); *H01J 37/32715* (2013.01); *H01L 21/67069* (2013.01);
(Continued)

(58) Field of Classification Search
CPC ........... H01J 37/32642; H01J 37/32715; H01J 2237/20235; H01L 21/67069; H01L 21/68735; H01L 21/68742
(Continued)

(56) References Cited

U.S. PATENT DOCUMENTS 3,534,753 A 10/1970 Ollivier
4,262,686 A 4/1981 Heim et al.
(Continued)

FOREIGN PATENT DOCUMENTS

CN 1189859 A 8/1998
CN 1682344 A 10/2005
(Continued)

OTHER PUBLICATIONS

Office Action issued in corresponding Korean Patent Application 1020170018561 mailed May 21, 2024.
(Continued)

*Primary Examiner* — Charlee J. C. Bennett

(57) ABSTRACT

A first edge ring for a substrate support is provided. The first edge ring includes an annular-shaped body and one or more lift pin receiving elements. The annular-shaped body is sized and shaped to surround an upper portion of the substrate support. The annular-shaped body defines an upper surface, a lower surface, a radially inner surface, and a radially outer surface. The one or more lift pin receiving elements are disposed along the lower surface of the annular-shaped body and sized and shaped to receive and provide kinematic coupling with top ends respectively of three or more lift pins.

51 Claims, 26 Drawing Sheets

Related U.S. Application Data

(60) Provisional application No. 62/718,112, filed on Aug. 13, 2018.

(52) U.S. Cl.
CPC .. *H01L 21/68735* (2013.01); *H01L 21/68742* (2013.01); *H01J 2237/20235* (2013.01)

(58) Field of Classification Search
USPC .................................................. 156/345.51
See application file for complete search history.

(56) References Cited

U.S. PATENT DOCUMENTS

| | | | |
|---|---|---|---|
| 4,374,698 | A | 2/1983 | Sanders et al. |
| 4,431,477 | A | 2/1984 | Zajac |
| 4,572,101 | A * | 2/1986 | Lee .................. B05C 13/02 211/41.18 |
| 4,793,897 | A | 12/1988 | Dunfield et al. |
| 4,902,186 | A * | 2/1990 | Akagawa .......... H01L 21/67326 414/757 |
| 5,033,406 | A * | 7/1991 | Lee .................. B05C 13/00 118/728 |
| 5,044,943 | A * | 9/1991 | Bowman ............. C23C 16/4584 118/500 |
| 5,190,823 | A | 3/1993 | Anthony et al. |
| 5,220,515 | A | 6/1993 | Freerks et al. |
| 5,304,248 | A | 4/1994 | Cheng et al. |
| 5,329,965 | A | 7/1994 | Gordon |
| 5,346,578 | A | 9/1994 | Benzing et al. |
| 5,376,214 | A | 12/1994 | Iwasaki et al. |
| 5,413,145 | A | 5/1995 | Rhyne et al. |
| 5,435,075 | A * | 7/1995 | Shiraishi .......... H01L 21/67034 34/317 |
| 5,520,969 | A | 5/1996 | Nishizato et al. |
| 5,529,657 | A | 6/1996 | Ishii |
| 5,569,350 | A | 10/1996 | Osada et al. |
| 5,605,179 | A | 2/1997 | Strong, Jr. et al. |
| 5,660,673 | A | 8/1997 | Miyoshi |
| 5,662,143 | A | 9/1997 | Caughran |
| 5,683,118 | A * | 11/1997 | Slocum .............. F16L 25/0018 285/119 |
| 5,683,517 | A | 11/1997 | Shan |
| 5,702,530 | A | 12/1997 | Shan et al. |
| 5,744,695 | A | 4/1998 | Forbes |
| 5,762,714 | A * | 6/1998 | Mohn ............... H01J 37/32623 118/728 |
| 5,792,272 | A | 8/1998 | van Os et al. |
| 5,837,058 | A | 11/1998 | Chen et al. |
| 5,840,129 | A * | 11/1998 | Saenz .............. H01L 21/68728 414/757 |
| 5,851,299 | A | 12/1998 | Cheng et al. |
| 5,886,863 | A | 3/1999 | Nagasaki et al. |
| 5,907,221 | A | 5/1999 | Sato et al. |
| 5,942,039 | A | 8/1999 | Kholodenko et al. |
| 5,952,060 | A | 9/1999 | Ravi |
| 6,022,809 | A | 2/2000 | Fan |
| 6,042,687 | A | 3/2000 | Singh et al. |
| 6,044,534 | A | 4/2000 | Seo et al. |
| 6,048,403 | A | 4/2000 | Deaton et al. |
| 6,050,283 | A | 4/2000 | Hoffman et al. |
| 6,060,400 | A | 5/2000 | Oehrlein et al. |
| 6,062,256 | A | 5/2000 | Miller et al. |
| 6,074,959 | A | 6/2000 | Wang et al. |
| 6,152,168 | A | 11/2000 | Ohmi et al. |
| 6,206,976 | B1 | 3/2001 | Crevasse et al. |
| 6,210,593 | B1 | 4/2001 | Ohkuni et al. |
| 6,217,937 | B1 | 4/2001 | Shealy |
| 6,231,716 | B1 | 5/2001 | White et al. |
| 6,294,466 | B1 | 9/2001 | Chang |
| 6,328,808 | B1 | 12/2001 | Tsai et al. |
| 6,376,386 | B1 | 4/2002 | Oshima |
| 6,432,849 | B1 * | 8/2002 | Endo .................. H01L 21/6732 206/710 |
| 6,435,798 | B1 * | 8/2002 | Satoh ................ H01L 21/68742 414/217 |
| 6,492,774 | B1 | 12/2002 | Han et al. |
| 6,508,911 | B1 | 1/2003 | Han et al. |
| 6,511,543 | B1 * | 1/2003 | Stauss ............... H01L 21/68721 118/503 |
| 6,589,352 | B1 | 7/2003 | Yudovsky et al. |
| 6,605,352 | B1 | 8/2003 | Windischmann |
| 6,623,597 | B1 | 9/2003 | Han et al. |
| 6,709,547 | B1 | 3/2004 | Ni et al. |
| 6,722,642 | B1 | 4/2004 | Sutton et al. |
| 6,736,931 | B2 | 5/2004 | Collins et al. |
| 6,744,212 | B2 | 6/2004 | Fischer et al. |
| 6,818,560 | B1 | 11/2004 | Koshimizu et al. |
| 6,841,943 | B2 | 1/2005 | Vahedi et al. |
| 6,896,765 | B2 | 5/2005 | Steger |
| 6,898,558 | B2 | 5/2005 | Klekotka |
| 6,935,466 | B2 * | 8/2005 | Lubomirsky ..... H01L 21/68742 414/217 |
| 6,962,879 | B2 | 11/2005 | Zhu et al. |
| 7,129,171 | B2 | 10/2006 | Zhu et al. |
| 7,288,482 | B2 | 10/2007 | Panda et al. |
| 7,309,646 | B1 | 12/2007 | Heo et al. |
| 7,311,784 | B2 | 12/2007 | Fink |
| 7,338,907 | B2 | 3/2008 | Li et al. |
| 7,378,128 | B2 | 5/2008 | Rancoule |
| 7,431,788 | B2 | 10/2008 | Ricci et al. |
| 7,481,944 | B2 | 1/2009 | Nozawa et al. |
| 7,736,998 | B2 | 6/2010 | Morita et al. |
| 7,757,541 | B1 | 7/2010 | Monkowski et al. |
| 7,758,698 | B2 | 7/2010 | Bang et al. |
| 7,882,800 | B2 | 2/2011 | Koshiishi et al. |
| 7,968,469 | B2 | 6/2011 | Collins et al. |
| 7,988,813 | B2 | 8/2011 | Chen et al. |
| 8,137,463 | B2 | 3/2012 | Liu et al. |
| 8,177,910 | B2 | 5/2012 | Schmid et al. |
| 8,291,935 | B1 | 10/2012 | Merritt et al. |
| 8,485,128 | B2 | 7/2013 | Kellogg et al. |
| 8,552,334 | B2 | 10/2013 | Tappan et al. |
| 8,555,920 | B2 | 10/2013 | Hirata et al. |
| 8,592,328 | B2 | 11/2013 | Hausmann et al. |
| 8,826,855 | B2 | 9/2014 | Kellogg et al. |
| 8,889,024 | B2 | 11/2014 | Watanabe et al. |
| 8,956,980 | B1 | 2/2015 | Chen et al. |
| 8,999,106 | B2 | 4/2015 | Liu et al. |
| 9,011,637 | B2 | 4/2015 | Yamamoto |
| 9,051,647 | B2 | 6/2015 | Cooperberg et al. |
| 9,059,678 | B2 | 6/2015 | Long et al. |
| 9,142,391 | B2 | 9/2015 | Yamamoto |
| 9,318,343 | B2 | 4/2016 | Ranjan et al. |
| 9,412,555 | B2 | 8/2016 | Augustino et al. |
| 9,471,065 | B2 | 10/2016 | Koyomogi et al. |
| 9,640,409 | B1 | 5/2017 | Yang et al. |
| 9,698,042 | B1 | 7/2017 | Baldasseroni et al. |
| 9,779,916 | B2 | 10/2017 | Dhindsa et al. |
| 10,096,471 | B2 | 10/2018 | Canniff |
| 10,147,588 | B2 | 12/2018 | Eason et al. |
| 10,410,832 | B2 | 9/2019 | Zhang et al. |
| 10,490,392 | B2 | 11/2019 | Ishizawa |
| 10,504,738 | B2 | 12/2019 | Lin et al. |
| 10,510,516 | B2 | 12/2019 | Lin et al. |
| 10,591,934 | B2 | 3/2020 | Gopalakrishnan et al. |
| 10,651,015 | B2 | 5/2020 | Angelov et al. |
| 10,658,222 | B2 | 5/2020 | Yan et al. |
| 10,699,878 | B2 | 6/2020 | Caron et al. |
| 10,825,659 | B2 | 11/2020 | Treadwell et al. |
| 10,957,561 | B2 | 3/2021 | Drewery et al. |
| 10,985,078 | B2 * | 4/2021 | Kenworthy ....... H01J 37/32715 |
| 11,798,789 | B2 * | 10/2023 | Sanchez ........... H01J 37/32642 |
| 2001/0002581 | A1 | 6/2001 | Nishikawa et al. |
| 2001/0004903 | A1 | 6/2001 | Ohmi et al. |
| 2001/0013363 | A1 | 8/2001 | Kitayama et al. |
| 2001/0035530 | A1 | 11/2001 | Udagawa |
| 2002/0038669 | A1 | 4/2002 | Yamagishi et al. |
| 2002/0042205 | A1 | 4/2002 | McMillin et al. |
| 2002/0043337 | A1 * | 4/2002 | Goodman ........ H01L 21/68728 156/345.12 |
| 2002/0045265 | A1 | 4/2002 | Bergh et al. |
| 2002/0046991 | A1 | 4/2002 | Smith et al. |

(56) References Cited

U.S. PATENT DOCUMENTS

| | | |
|---|---|---|
| 2002/0048536 A1 | 4/2002 | Bergh et al. |
| 2002/0053513 A1 | 5/2002 | Stimson et al. |
| 2002/0067585 A1 | 6/2002 | Fujiwara |
| 2002/0071128 A1 | 6/2002 | Doan |
| 2002/0072240 A1 | 6/2002 | Koike |
| 2002/0088542 A1 | 7/2002 | Nishikawa et al. |
| 2002/0092602 A1 | 7/2002 | Saito et al. |
| 2002/0160125 A1 | 10/2002 | Johnson et al. |
| 2002/0174905 A1 | 11/2002 | Latino et al. |
| 2002/0175144 A1 | 11/2002 | Hung et al. |
| 2003/0000369 A1 | 1/2003 | Funaki |
| 2003/0003696 A1 | 1/2003 | Gelatos et al. |
| 2003/0011619 A1 | 1/2003 | Jacobs et al. |
| 2003/0013080 A1 | 1/2003 | Luebke et al. |
| 2003/0015141 A1* | 1/2003 | Takagi ............... H01L 21/68735 118/728 |
| 2003/0021356 A1 | 1/2003 | Okuda et al. |
| 2003/0023023 A1 | 1/2003 | Harris et al. |
| 2003/0029571 A1* | 2/2003 | Goodman ......... H01L 21/68785 118/728 |
| 2003/0116195 A1 | 6/2003 | Weissgerber et al. |
| 2003/0130807 A1 | 7/2003 | Ambrosina et al. |
| 2003/0178145 A1* | 9/2003 | Anderson ......... H01L 21/68735 118/728 |
| 2003/0186563 A1 | 10/2003 | Kobayashi et al. |
| 2003/0196890 A1 | 10/2003 | Le et al. |
| 2003/0201069 A1 | 10/2003 | Johnson |
| 2003/0213560 A1 | 11/2003 | Wang et al. |
| 2003/0230239 A1 | 12/2003 | Shan |
| 2003/0231950 A1 | 12/2003 | Raaijmakers |
| 2003/0236592 A1 | 12/2003 | Shajii et al. |
| 2003/0236638 A1 | 12/2003 | Shajii et al. |
| 2003/0236643 A1 | 12/2003 | Shajii et al. |
| 2004/0007176 A1 | 1/2004 | Janakiraman et al. |
| 2004/0025060 A1 | 2/2004 | Raffaele et al. |
| 2004/0026149 A1 | 2/2004 | Wilkinson |
| 2004/0031338 A1 | 2/2004 | Chen et al. |
| 2004/0053428 A1 | 3/2004 | Steger |
| 2004/0060595 A1 | 4/2004 | Chittenden |
| 2004/0089240 A1 | 5/2004 | Dando et al. |
| 2004/0094206 A1 | 5/2004 | Ishida |
| 2004/0112538 A1 | 6/2004 | Larson et al. |
| 2004/0112539 A1 | 6/2004 | Larson et al. |
| 2004/0112540 A1 | 6/2004 | Larson et al. |
| 2004/0149389 A1 | 8/2004 | Fink |
| 2004/0163601 A1 | 8/2004 | Kadotani et al. |
| 2004/0168719 A1 | 9/2004 | Nambu |
| 2004/0173270 A1 | 9/2004 | Harris et al. |
| 2004/0200529 A1 | 10/2004 | Lull et al. |
| 2004/0250600 A1 | 12/2004 | Bevers et al. |
| 2004/0261492 A1 | 12/2004 | Zarkar et al. |
| 2005/0005994 A1 | 1/2005 | Sugiyama et al. |
| 2005/0041238 A1 | 2/2005 | Ludviksson et al. |
| 2005/0061447 A1 | 3/2005 | Kim et al. |
| 2005/0067021 A1 | 3/2005 | Bevers et al. |
| 2005/0082007 A1 | 4/2005 | Nguyen et al. |
| 2005/0133164 A1 | 6/2005 | Fischer et al. |
| 2005/0155625 A1 | 7/2005 | Jangjian et al. |
| 2005/0194100 A1 | 9/2005 | Or et al. |
| 2005/0199342 A1 | 9/2005 | Shajii et al. |
| 2005/0241763 A1 | 11/2005 | Huang et al. |
| 2006/0011237 A1 | 1/2006 | Tison et al. |
| 2006/0021223 A1 | 2/2006 | Wakayama et al. |
| 2006/0060141 A1 | 3/2006 | Kamaishi et al. |
| 2006/0090797 A1 | 5/2006 | Olander |
| 2006/0097644 A1 | 5/2006 | Kono et al. |
| 2006/0124169 A1 | 6/2006 | Mizusawa et al. |
| 2006/0207595 A1 | 9/2006 | Ohmi et al. |
| 2006/0212233 A1 | 9/2006 | Wong et al. |
| 2006/0237063 A1 | 10/2006 | Ding et al. |
| 2006/0283551 A1 | 12/2006 | Son |
| 2007/0023398 A1 | 2/2007 | Kobayashi et al. |
| 2007/0024077 A1 | 2/2007 | McClintock |
| 2007/0026684 A1 | 2/2007 | Parascandola et al. |
| 2007/0066038 A1 | 3/2007 | Sadjadi et al. |
| 2007/0131350 A1 | 6/2007 | Ricci et al. |
| 2007/0158025 A1 | 7/2007 | Larson |
| 2007/0170089 A1* | 7/2007 | Burns ............... H01L 21/67379 206/711 |
| 2007/0175391 A1 | 8/2007 | Mizusawa |
| 2007/0187363 A1 | 8/2007 | Oka et al. |
| 2007/0204797 A1 | 9/2007 | Fischer |
| 2007/0204914 A1 | 9/2007 | Kurosawa et al. |
| 2007/0208427 A1 | 9/2007 | Davidson et al. |
| 2007/0233412 A1 | 10/2007 | Gotoh et al. |
| 2007/0240778 A1 | 10/2007 | L'Bassi et al. |
| 2007/0256785 A1 | 11/2007 | Pamarthy et al. |
| 2007/0256786 A1 | 11/2007 | Zhou et al. |
| 2007/0259112 A1 | 11/2007 | Ishikawa et al. |
| 2007/0283882 A1 | 12/2007 | Cho et al. |
| 2007/0284344 A1 | 12/2007 | Todorov et al. |
| 2008/0014347 A1 | 1/2008 | Power |
| 2008/0072823 A1 | 3/2008 | Yudovsky et al. |
| 2008/0101978 A1 | 5/2008 | Ryabova et al. |
| 2008/0107506 A1* | 5/2008 | Babbs ............... H01L 21/67393 414/217 |
| 2008/0115834 A1 | 5/2008 | Geoffrion et al. |
| 2008/0121177 A1 | 5/2008 | Bang et al. |
| 2008/0121178 A1 | 5/2008 | Bang et al. |
| 2008/0174387 A1 | 7/2008 | Chiang |
| 2008/0202588 A1 | 8/2008 | Gold et al. |
| 2008/0202609 A1 | 8/2008 | Gold et al. |
| 2008/0202610 A1 | 8/2008 | Gold et al. |
| 2008/0223873 A1 | 9/2008 | Chen et al. |
| 2008/0236749 A1 | 10/2008 | Koshimizu et al. |
| 2008/0261800 A1 | 10/2008 | Yuan et al. |
| 2008/0314508 A1 | 12/2008 | Ricci et al. |
| 2008/0317564 A1 | 12/2008 | Cheng et al. |
| 2009/0015141 A1 | 1/2009 | Wang et al. |
| 2009/0056629 A1 | 3/2009 | Katz et al. |
| 2009/0061083 A1 | 3/2009 | Chiang et al. |
| 2009/0061640 A1 | 3/2009 | Wong et al. |
| 2009/0061644 A1 | 3/2009 | Chiang et al. |
| 2009/0067954 A1 | 3/2009 | Lanee et al. |
| 2009/0078196 A1 | 3/2009 | Midorikawa |
| 2009/0090174 A1 | 4/2009 | Paul et al. |
| 2009/0095364 A1 | 4/2009 | Itoh et al. |
| 2009/0151419 A1 | 6/2009 | Doniat et al. |
| 2009/0162952 A1 | 6/2009 | Liu et al. |
| 2009/0163037 A1 | 6/2009 | Miya et al. |
| 2009/0183548 A1 | 7/2009 | Monkowski et al. |
| 2009/0183549 A1 | 7/2009 | Monkowski et al. |
| 2009/0197423 A1 | 8/2009 | Koshimizu et al. |
| 2009/0209112 A1 | 8/2009 | Koelmel et al. |
| 2009/0221117 A1 | 9/2009 | Tan et al. |
| 2009/0236313 A1 | 9/2009 | Qiu et al. |
| 2009/0272717 A1 | 11/2009 | Pamarthy et al. |
| 2009/0279989 A1 | 11/2009 | Wong et al. |
| 2009/0320754 A1 | 12/2009 | Oya et al. |
| 2010/0012310 A1 | 1/2010 | Christensen et al. |
| 2010/0025369 A1 | 2/2010 | Negishi et al. |
| 2010/0030390 A1 | 2/2010 | Yamaguchi et al. |
| 2010/0059181 A1 | 3/2010 | Lee et al. |
| 2010/0071438 A1 | 3/2010 | Davis et al. |
| 2010/0108261 A1 | 5/2010 | Augustino et al. |
| 2010/0122655 A1 | 5/2010 | Tiner et al. |
| 2010/0144539 A1 | 6/2010 | Bergh et al. |
| 2010/0145633 A1 | 6/2010 | Yasuda |
| 2010/0178770 A1 | 7/2010 | Zin |
| 2010/0197070 A1 | 8/2010 | Stoddard et al. |
| 2010/0216313 A1 | 8/2010 | Iwai |
| 2010/0229976 A1 | 9/2010 | Hirata et al. |
| 2010/0264117 A1 | 10/2010 | Ohmi et al. |
| 2010/0269924 A1 | 10/2010 | Yasuda |
| 2010/0272347 A1 | 10/2010 | Rodnick et al. |
| 2010/0273334 A1 | 10/2010 | Koelmel et al. |
| 2011/0019332 A1 | 1/2011 | Chistyakov |
| 2011/0025322 A1 | 2/2011 | Yamazaki et al. |
| 2011/0026588 A1 | 2/2011 | Boyce |
| 2011/0026595 A1 | 2/2011 | Yasuda et al. |
| 2011/0031111 A1 | 2/2011 | Kobayashi |
| 2011/0094596 A1 | 4/2011 | Sugiyama et al. |
| 2011/0108524 A1 | 5/2011 | Dhindsa et al. |
| 2011/0126984 A1 | 6/2011 | Kang et al. |

(56) References Cited

U.S. PATENT DOCUMENTS

| | | |
|---|---|---|
| 2011/0135821 A1 | 6/2011 | Ding |
| 2011/0157760 A1 | 6/2011 | Willwerth et al. |
| 2011/0229837 A1 | 9/2011 | Migita |
| 2011/0253225 A1 | 10/2011 | Beeby et al. |
| 2011/0259262 A1 | 10/2011 | Khattak et al. |
| 2011/0265883 A1 | 11/2011 | Cruse et al. |
| 2011/0265951 A1 | 11/2011 | Xu et al. |
| 2011/0287631 A1 | 11/2011 | Yamamoto |
| 2011/0303696 A1 | 12/2011 | Kelekar et al. |
| 2012/0031500 A1 | 2/2012 | Hirose et al. |
| 2012/0032756 A1 | 2/2012 | Long et al. |
| 2012/0034786 A1 | 2/2012 | Dhindsa et al. |
| 2012/0080092 A1 | 4/2012 | Singh et al. |
| 2012/0091108 A1 | 4/2012 | Lin et al. |
| 2012/0097266 A1 | 4/2012 | Cobb et al. |
| 2012/0149213 A1 | 6/2012 | Nittala et al. |
| 2012/0152364 A1 | 6/2012 | Hashimoto et al. |
| 2012/0156363 A1 | 6/2012 | Quinn et al. |
| 2012/0174990 A1 | 7/2012 | Yasuda |
| 2012/0175062 A1 | 7/2012 | de la Llera et al. |
| 2012/0176692 A1 | 7/2012 | Yamawaku et al. |
| 2012/0190208 A1 | 7/2012 | Ozu et al. |
| 2012/0238102 A1 | 9/2012 | Zhang et al. |
| 2012/0238103 A1 | 9/2012 | Zhang et al. |
| 2012/0244715 A1 | 9/2012 | Lebouitz et al. |
| 2012/0247386 A1 | 10/2012 | Sanchez et al. |
| 2012/0280429 A1 | 11/2012 | Ravi et al. |
| 2012/0282162 A1 | 11/2012 | Skelton et al. |
| 2012/0289057 A1 | 11/2012 | DeDontney |
| 2012/0298221 A1 | 11/2012 | Takeuchi et al. |
| 2012/0305184 A1 | 12/2012 | Singh et al. |
| 2012/0312800 A1 | 12/2012 | Chartier et al. |
| 2012/0328780 A1 | 12/2012 | Yamagishi |
| 2013/0000731 A1 | 1/2013 | Singh et al. |
| 2013/0008607 A1 | 1/2013 | Matsumoto et al. |
| 2013/0025715 A1 | 1/2013 | Yamaguchi et al. |
| 2013/0029494 A1 | 1/2013 | Sasaki et al. |
| 2013/0029496 A1 | 1/2013 | Bauer et al. |
| 2013/0045605 A1 | 2/2013 | Wang et al. |
| 2013/0085618 A1 | 4/2013 | Ding |
| 2013/0104996 A1 | 5/2013 | Oh et al. |
| 2013/0106286 A1 | 5/2013 | Banna et al. |
| 2013/0131300 A1 | 5/2013 | Olmscheid et al. |
| 2013/0135058 A1 | 5/2013 | Long et al. |
| 2013/0145816 A1 | 6/2013 | Lowe |
| 2013/0155568 A1 | 6/2013 | Todorow et al. |
| 2013/0157388 A1 | 6/2013 | Grimbergen |
| 2013/0220433 A1 | 8/2013 | Sawada et al. |
| 2013/0255784 A1 | 10/2013 | Ye et al. |
| 2013/0256962 A1 | 10/2013 | Ranish et al. |
| 2013/0270997 A1 | 10/2013 | Zhao et al. |
| 2013/0284374 A1 | 10/2013 | Lubomirsky et al. |
| 2013/0288477 A1 | 10/2013 | Rieschl et al. |
| 2013/0313785 A1 | 11/2013 | Otschik et al. |
| 2013/0334038 A1 | 12/2013 | Riker et al. |
| 2014/0017900 A1* | 1/2014 | Doba ............... H01J 37/32091 |
| | | 156/345.28 |
| 2014/0020764 A1 | 1/2014 | Woelk et al. |
| 2014/0033828 A1 | 2/2014 | Larson et al. |
| 2014/0034243 A1 | 2/2014 | Dhindsa et al. |
| 2014/0080308 A1 | 3/2014 | Chen et al. |
| 2014/0094039 A1 | 4/2014 | Ranish et al. |
| 2014/0120737 A1 | 5/2014 | Swaminathan et al. |
| 2014/0141621 A1 | 5/2014 | Ren et al. |
| 2014/0144471 A1 | 5/2014 | Kahlon et al. |
| 2014/0182689 A1 | 7/2014 | Shareef et al. |
| 2014/0190822 A1 | 7/2014 | Riker et al. |
| 2014/0213055 A1 | 7/2014 | Himori et al. |
| 2014/0235063 A1 | 8/2014 | McMillin et al. |
| 2014/0248780 A1 | 9/2014 | Ingle et al. |
| 2014/0262038 A1 | 9/2014 | Wang et al. |
| 2014/0262763 A1 | 9/2014 | Rasheed et al. |
| 2014/0263177 A1 | 9/2014 | Povolny et al. |
| 2014/0272459 A1 | 9/2014 | Daugherty et al. |
| 2014/0273460 A1 | 9/2014 | Reyland et al. |
| 2014/0273505 A1 | 9/2014 | Hsieh et al. |
| 2014/0311676 A1 | 10/2014 | Hatoh et al. |
| 2015/0009906 A1 | 1/2015 | Dore et al. |
| 2015/0010381 A1 | 1/2015 | Cai |
| 2015/0017810 A1 | 1/2015 | Guha |
| 2015/0037183 A1 | 2/2015 | Rood et al. |
| 2015/0044873 A1 | 2/2015 | Kellogg |
| 2015/0059859 A1 | 3/2015 | Takahashi et al. |
| 2015/0099066 A1 | 4/2015 | Huotari et al. |
| 2015/0099365 A1 | 4/2015 | Chen et al. |
| 2015/0107773 A1 | 4/2015 | Shintaku et al. |
| 2015/0179412 A1 | 6/2015 | Chhatre et al. |
| 2015/0181684 A1 | 6/2015 | Banna et al. |
| 2015/0184287 A1 | 7/2015 | Tsung et al. |
| 2015/0187631 A1 | 7/2015 | Ranish et al. |
| 2015/0234390 A1 | 8/2015 | Koyomogi et al. |
| 2015/0262793 A1 | 9/2015 | Okunishi et al. |
| 2015/0287572 A1 | 10/2015 | Daugherty et al. |
| 2015/0336275 A1 | 11/2015 | Mazzocco et al. |
| 2015/0340209 A1 | 11/2015 | Koltonski |
| 2015/0371831 A1 | 12/2015 | Rozenzon et al. |
| 2015/0373783 A1 | 12/2015 | Kitagawa |
| 2016/0035610 A1 | 2/2016 | Park et al. |
| 2016/0039126 A1 | 2/2016 | Tan et al. |
| 2016/0046451 A1 | 2/2016 | German |
| 2016/0099162 A1 | 4/2016 | Ng et al. |
| 2016/0111258 A1 | 4/2016 | Taskar et al. |
| 2016/0172165 A1 | 6/2016 | Jeon et al. |
| 2016/0181116 A1 | 6/2016 | Berry, III et al. |
| 2016/0204019 A1 | 7/2016 | Ishii et al. |
| 2016/0211165 A1 | 7/2016 | McChesney et al. |
| 2016/0211166 A1* | 7/2016 | Yan ................... H01L 21/67069 |
| 2016/0215392 A1 | 7/2016 | Yudovsky et al. |
| 2016/0247688 A1 | 8/2016 | Zhu et al. |
| 2016/0293431 A1 | 10/2016 | Sriraman et al. |
| 2016/0307742 A1 | 10/2016 | Mishra et al. |
| 2016/0372321 A1 | 12/2016 | Krishnan et al. |
| 2017/0011892 A1 | 1/2017 | Guo et al. |
| 2017/0018407 A1 | 1/2017 | Kondo |
| 2017/0032982 A1 | 2/2017 | Drewery et al. |
| 2017/0040148 A1 | 2/2017 | Augustino et al. |
| 2017/0043527 A1 | 2/2017 | Uttaro |
| 2017/0062769 A1 | 3/2017 | Kim et al. |
| 2017/0069464 A1 | 3/2017 | Ye et al. |
| 2017/0069511 A1 | 3/2017 | Yang et al. |
| 2017/0110335 A1 | 4/2017 | Yang et al. |
| 2017/0111025 A1 | 4/2017 | Kapoor et al. |
| 2017/0113355 A1 | 4/2017 | Genetti et al. |
| 2017/0115657 A1 | 4/2017 | Trussell et al. |
| 2017/0125274 A1 | 5/2017 | Swaminathan et al. |
| 2017/0133283 A1 | 5/2017 | Kenworthy |
| 2017/0200586 A1 | 7/2017 | Treadwell et al. |
| 2017/0213751 A1 | 7/2017 | Oohashi |
| 2017/0213758 A1* | 7/2017 | Rice ................. H01J 37/32082 |
| 2017/0236688 A1 | 8/2017 | Caron et al. |
| 2017/0236694 A1 | 8/2017 | Eason et al. |
| 2017/0236741 A1 | 8/2017 | Angelov et al. |
| 2017/0236743 A1 | 8/2017 | Severson et al. |
| 2017/0256393 A1 | 9/2017 | Kim et al. |
| 2017/0256435 A1 | 9/2017 | Joubert et al. |
| 2017/0263478 A1 | 9/2017 | McChesney et al. |
| 2017/0278679 A1 | 9/2017 | Angelov et al. |
| 2017/0287682 A1 | 10/2017 | Musselman et al. |
| 2017/0287753 A1 | 10/2017 | Musselman et al. |
| 2017/0326733 A1 | 11/2017 | Ramachandran et al. |
| 2018/0019107 A1 | 1/2018 | Ishizawa |
| 2018/0052104 A1 | 2/2018 | Larsson et al. |
| 2018/0053629 A1* | 2/2018 | Zhang ................ H01J 37/3244 |
| 2018/0114716 A1 | 4/2018 | Hao et al. |
| 2018/0138069 A1 | 5/2018 | Tan et al. |
| 2018/0155838 A1 | 6/2018 | Rasheed et al. |
| 2018/0166259 A1 | 6/2018 | Ueda |
| 2018/0190526 A1 | 7/2018 | Hao et al. |
| 2018/0218933 A1 | 8/2018 | Luere et al. |
| 2018/0277416 A1 | 9/2018 | Takahashi et al. |
| 2018/0308737 A1* | 10/2018 | Moriya ............... H01L 21/6831 |
| 2018/0358211 A1 | 12/2018 | Mun |
| 2019/0013232 A1 | 1/2019 | Yan et al. |
| 2019/0027988 A1 | 1/2019 | Filipenko et al. |

(56) References Cited

U.S. PATENT DOCUMENTS

| | | | |
|---|---|---|---|
| 2019/0103722 A1 | 4/2019 | Kieu | |
| 2019/0228952 A1 | 7/2019 | Dorf et al. | |
| 2019/0279888 A1 | 9/2019 | Gopalakrishnan et al. | |
| 2019/0363003 A1 | 11/2019 | Sarode Vishwanath | |
| 2020/0004954 A1 | 1/2020 | Zawadowskiy et al. | |
| 2020/0020565 A1 | 1/2020 | Rathnasinghe et al. | |
| 2020/0049547 A1 | 2/2020 | Spyropoulos et al. | |
| 2020/0234928 A1 | 7/2020 | Vishwanath | |
| 2020/0234981 A1 | 7/2020 | Schmid et al. | |
| 2020/0303224 A1 | 9/2020 | Yoshimori | |
| 2020/0312633 A1 | 10/2020 | Rathnasinghe et al. | |
| 2020/0328105 A1 | 10/2020 | Sun et al. | |
| 2020/0395195 A1* | 12/2020 | Sanchez | H01L 21/67069 |
| 2021/0043428 A1* | 2/2021 | Noorbakhsh | H01L 21/6833 |
| 2021/0057256 A1* | 2/2021 | Bergantz | H01L 21/681 |
| 2021/0066052 A1* | 3/2021 | Emura | H01L 21/68742 |
| 2021/0111007 A1* | 4/2021 | Kim | H01L 21/67069 |
| 2021/0291374 A1* | 9/2021 | Bergantz | H01L 21/68707 |
| 2021/0327688 A1 | 10/2021 | Sasaki et al. | |
| 2021/0384013 A1 | 12/2021 | Jung et al. | |
| 2022/0122878 A1* | 4/2022 | Wu | H01L 21/68714 |
| 2022/0246408 A1* | 8/2022 | Genetti | B65D 85/02 |
| 2022/0254612 A1 | 8/2022 | Kimball et al. | |
| 2022/0270863 A1 | 8/2022 | Kimball et al. | |
| 2022/0319904 A1 | 10/2022 | Rice et al. | |
| 2022/0359169 A1 | 11/2022 | Koai et al. | |

FOREIGN PATENT DOCUMENTS

| | | | |
|---|---|---|---|
| CN | 1701421 A | 11/2005 | |
| CN | 101238553 A | 8/2008 | |
| CN | 101552182 A | 10/2009 | |
| CN | 102243977 A | 11/2011 | |
| CN | 202076225 U | 12/2011 | |
| CN | 102315150 A | 1/2012 | |
| CN | 102610476 A | 7/2012 | |
| CN | 103730318 A | 4/2014 | |
| CN | 104205321 A | 12/2014 | |
| CN | 104299929 A | 1/2015 | |
| CN | 104752141 A | 7/2015 | |
| CN | 104851832 A | 8/2015 | |
| CN | 105336561 A | 2/2016 | |
| CN | 105810609 A | 7/2016 | |
| CN | 106469637 A | 3/2017 | |
| CN | 107086168 A | 8/2017 | |
| CN | 107093569 A | 8/2017 | |
| CN | 107768275 A | 3/2018 | |
| CN | 108369922 A | 8/2018 | |
| CN | 112563108 A | 3/2021 | |
| CN | 212874484 U | 4/2021 | |
| DE | 102016212780 A1 * | 1/2018 | H01L 21/68742 |
| EA | EU-0875919 A2 | 11/1998 | |
| EP | 0424299 A2 | 4/1991 | |
| EP | 0821403 A2 | 1/1998 | |
| EP | 0821404 A2 | 1/1998 | |
| EP | 0838842 A2 | 4/1998 | |
| EP | 875919 A2 | 11/1998 | |
| EP | 0875979 A1 | 11/1998 | |
| EP | 1202328 A2 | 5/2002 | |
| JP | H02-93063 A | 4/1990 | |
| JP | H07106316 A | 4/1995 | |
| JP | H07221024 A | 8/1995 | |
| JP | H10-280173 A | 10/1998 | |
| JP | 2000036488 A | 2/2000 | |
| JP | 20000124141 A | 4/2000 | |
| JP | 3076791 B2 | 8/2000 | |
| JP | 2001230239 A | 8/2001 | |
| JP | 2001522142 A | 11/2001 | |
| JP | 2002500439 A | 1/2002 | |
| JP | 2002503765 A | 2/2002 | |
| JP | 2002-176030 A | 6/2002 | |
| JP | 2002-217171 A | 8/2002 | |
| JP | 2002-231794 A | 8/2002 | |
| JP | 2003-513434 A | 4/2003 | |
| JP | 2004-266127 A | 9/2004 | |
| JP | 2004296553 A | 10/2004 | |
| JP | 2006173223 A | 6/2006 | |
| JP | 2006186171 A | 7/2006 | |
| JP | 2006-344701 A | 12/2006 | |
| JP | 2007207808 A | 8/2007 | |
| JP | 2007-234867 A | 9/2007 | |
| JP | 2007321244 A | 12/2007 | |
| JP | 2007535819 A | 12/2007 | |
| JP | 2008027936 A | 2/2008 | |
| JP | 2008159931 A | 7/2008 | |
| JP | 2008-244274 A | 10/2008 | |
| JP | 2008-251681 A | 10/2008 | |
| JP | 2010034416 A | 2/2010 | |
| JP | 2010267894 A | 11/2010 | |
| JP | 2011-54933 A | 3/2011 | |
| JP | 2011210853 A | 10/2011 | |
| JP | 2012-049376 A | 3/2012 | |
| JP | 201264671 A | 3/2012 | |
| JP | 2012507860 A | 3/2012 | |
| JP | 2012-146743 A | 8/2012 | |
| JP | 2012146742 | 8/2012 | |
| JP | 2012216614 A | 11/2012 | |
| JP | 2012222235 A | 11/2012 | |
| JP | 201342012 A | 2/2013 | |
| JP | 2013511847 A | 4/2013 | |
| JP | 2013526063 A | 6/2013 | |
| JP | 2013530516 A | 7/2013 | |
| JP | 2013172013 A | 9/2013 | |
| JP | 201490177 | 5/2014 | |
| JP | 2014084523 A | 5/2014 | |
| JP | 20155755 | 1/2015 | |
| JP | 2015109249 A | 6/2015 | |
| JP | 2015115421 A | 6/2015 | |
| JP | 5767373 B2 | 8/2015 | |
| JP | 2015201552 A | 11/2015 | |
| JP | 2016046451 A | 4/2016 | |
| JP | 2016-146472 A | 8/2016 | |
| JP | 2016530706 A | 9/2016 | |
| JP | 2016-219820 A | 12/2016 | |
| JP | 3210105 U | 4/2017 | |
| JP | 2017085072 A | 5/2017 | |
| JP | 2017092435 A | 5/2017 | |
| JP | 2017092448 A | 5/2017 | |
| JP | 2017131927 A | 8/2017 | |
| JP | 2017183701 A | 10/2017 | |
| JP | 2018010992 A | 1/2018 | |
| JP | 2018098239 A | 6/2018 | |
| JP | 2018125519 A | 8/2018 | |
| JP | 2018160666 A | 10/2018 | |
| JP | 2019505088 A | 2/2019 | |
| JP | 2019192734 A | 10/2019 | |
| JP | 2020043137 A | 3/2020 | |
| JP | 2020519016 A | 6/2020 | |
| JP | 2022031361 A | 2/2022 | |
| KR | 10-1998-0086673 A | 12/1998 | |
| KR | 19980086673 A | 12/1998 | |
| KR | 20010112277 A | 12/2001 | |
| KR | 20020002704 A | 1/2002 | |
| KR | 20020031417 A | 5/2002 | |
| KR | 1020020031417 A | 5/2002 | |
| KR | 20020071398 A | 9/2002 | |
| KR | 20167013192 | 1/2003 | |
| KR | 20030065126 A | 8/2003 | |
| KR | 20040050080 A | 6/2004 | |
| KR | 20050008792 A | 1/2005 | |
| KR | 2005-0038898 A | 4/2005 | |
| KR | 100578129 B1 | 5/2006 | |
| KR | 20070073704 A | 7/2007 | |
| KR | 100783062 B1 | 12/2007 | |
| KR | 100803858 B1 | 2/2008 | |
| KR | 20080013552 A | 2/2008 | |
| KR | 20080023569 A | 3/2008 | |
| KR | 100849179 B1 | 7/2008 | |
| KR | 20090024075 A | 3/2009 | |
| KR | 20090080520 A | 7/2009 | |
| KR | 1020090080520 A | 7/2009 | |
| KR | 20090094290 A | 9/2009 | |
| KR | 2010-0105695 A | 9/2010 | |
| KR | 20100123724 A | 11/2010 | |

(56) References Cited

FOREIGN PATENT DOCUMENTS

| | | |
|---|---|---|
| KR | 20110005665 U | 6/2011 |
| KR | 2011-0125188 A | 11/2011 |
| KR | 20110123519 A | 11/2011 |
| KR | 20110137775 A | 12/2011 |
| KR | 2013-0124616 A | 11/2013 |
| KR | 20130137962 A | 12/2013 |
| KR | 20140001540 A | 1/2014 |
| KR | 20140014005 | 2/2014 |
| KR | 2014-0101870 A | 8/2014 |
| KR | 2014-0103872 A | 8/2014 |
| KR | 2014-0132542 A | 11/2014 |
| KR | 20160014088 A | 2/2016 |
| KR | 10-2016-0063412 A | 6/2016 |
| KR | 10-2016-0088820 A | 7/2016 |
| KR | 20160088820 A | 7/2016 |
| KR | 2017-0037526 A | 4/2017 |
| KR | 20180099776 A | 9/2018 |
| KR | 101927936 B1 | 12/2018 |
| KR | 20190017721 A | 2/2019 |
| KR | 20190026898 A | 3/2019 |
| KR | 10-1974422 B1 | 5/2019 |
| KR | 101974420 B1 | 5/2019 |
| KR | 20190068490 A | 6/2019 |
| TW | 506234 B | 10/2002 |
| TW | 200302035 A | 7/2003 |
| TW | 200520137 A | 6/2005 |
| TW | 200525635 A | 8/2005 |
| TW | 1267563 B | 12/2006 |
| TW | 201001588 A | 1/2010 |
| TW | 201207933 A | 2/2012 |
| TW | 201246327 A | 11/2012 |
| TW | 201324653 A | 6/2013 |
| TW | 201347063 A | 11/2013 |
| TW | 201351532 A | 12/2013 |
| TW | 201426854 A | 7/2014 |
| TW | 201436089 | 9/2014 |
| TW | 201447965 A | 12/2014 |
| TW | 201503209 A | 1/2015 |
| TW | M492915 U | 1/2015 |
| TW | 201528310 A | 7/2015 |
| TW | 201532106 A | 8/2015 |
| TW | 201601208 A | 1/2016 |
| TW | 201626427 A | 7/2016 |
| TW | 201630107 A | 8/2016 |
| TW | 201639074 A | 11/2016 |
| TW | 201719709 A | 6/2017 |
| TW | 201737290 A | 10/2017 |
| TW | 201817899 A | 5/2018 |
| TW | 201926536 A | 7/2019 |
| TW | 201935593 A | 9/2019 |
| WO | WO-0040776 A1 | 7/2000 |
| WO | WO-0113404 A1 | 2/2001 |
| WO | WO-2007008509 A2 | 1/2007 |
| WO | WO-2009086109 A2 | 7/2009 |
| WO | WO-2011051251 A1 | 5/2011 |
| WO | WO-2013108750 A1 | 7/2013 |
| WO | WO-2013123617 A1 | 8/2013 |
| WO | WO-2014068886 A1 | 5/2014 |
| WO | WO-2014163742 A1 | 10/2014 |
| WO | WO-2014209492 A1 | 12/2014 |
| WO | WO-2017131927 A1 | 8/2017 |
| WO | WO-2017155812 A1 | 9/2017 |
| WO | WO-2018010986 A1 | 1/2018 |
| WO | WO-2019022707 A1 | 1/2019 |
| WO | WO-2019022708 A1 | 1/2019 |
| WO | WO-2019103722 A1 | 5/2019 |
| WO | WO-2019112903 A1 | 6/2019 |
| WO | WO-2019143858 A1 | 7/2019 |
| WO | WO-2020036613 A1 | 2/2020 |
| WO | WO-2020-180656 A1 | 9/2020 |
| WO | WO-2021025934 A1 | 2/2021 |
| WO | WO-2021026110 A1 | 2/2021 |
| WO | WO-2021030184 A1 | 2/2021 |
| WO | WO-2021-167897 A1 | 8/2021 |
| WO | WO-2021-194470 A1 | 9/2021 |
| WO | WO-2022076227 A1 | 4/2022 |

OTHER PUBLICATIONS

Office Action issued in corresponding Korean Patent Application No. 1020170018549 dated May 28, 2024.
O.W. Purbo et al., 'Reactive Ion Etching of Soi (SIMOX and ZMR) Silicon in Nitrogen Containing $CF_4 + O_2$ and $SF_6 + O_2$ Plasmas', the J. Electrochem. Soc., (Sep. 30, 1993).
L. Jiang et al., 'Impact of Ar addition to inductively coupled plasma etching of SiC in SF6/O2', Microelectron. Eng., (Mar. 18, 2004).
International Search Report and Written Opinion of the ISA issued in PCT/US2018/050273, mailed May 13, 2019; ISA/KR.
Notice of Reason for Refusal issued in corresponding Japanese patent application No. 2019-505020 dated Oct. 16, 2020.
Office Action issued in corresponding Korean Patent Application No. 10-2018-7028683 dated Nov. 26, 2020.
Office Action issued in corresponding Taiwanese Patent Application No. 10-2018-7028683 dated Nov. 26, 2020.
Office Action issued in corresponding Taiwanese Patent Application No. 109128923 dated May 11, 2021 (4 pages).
Office Action issued in corresponding Korean Patent Application No. 10-2018-7028683 dated Apr. 27, 2022 ..
Supplementary Partial European Search Report issued in corresponding European U.S. Appl. No. 18/929,891 dated Mar. 18, 2022.
Office Action issued in corresponding Korean Patent Application 10-2018-7028683 dated Dec. 29, 2022.
Office Action issued in corresponding Japanese Patent Application 2022-31361 dated Jan. 17, 2023 (No. English translation available).
Office Action issued in corresponding Taiwanese Patent Application 111104002 dated Mar. 6, 2023.
Office Action issued in corresponding Chinese Patent Application 201880002160.6 dated Mar. 23, 2023.
International Search Report and Written Opinion of the ISA issued in PCT/US2020/045389, mailed Nov. 17, 2020; ISA/KR.
Translation of Second Office Action dated Feb. 16, 2021 corresponding to Japanese Application No. 2017-039058, 4 pages.
First Office Action corresponding to Taiwanese Patent Application No. 106106790 dated Oct. 7, 2020, 7 pages.
First Office Action corresponding to Chinese Patent Application No. 201710122891.1 dated Apr. 10, 2020, 14 pages.
Second Office Action corresponding to Chinese Patent Application No. 201710122891.1 dated Dec. 3, 2020, 5 pages.
MP125E N-470 Linear Drive User Manual; Version 1.1.0; Date Sep. 18, 2014; 54 Pages; Physik Instrumente (PI) GmbH & Co. KG, Auf der Roemerstr. 1, 76228 Karlsruhe, Germany.
First Office Action dated Dec. 29, 2017 corresponding to Chinese Patent Application No. 201610032252.1, 12 pages.
First Office Action dated Aug. 2, 2018 corresponding to Chinese Patent Application No. 201710036188.9, 7 pages.
Bohr, Mark, "The New Era of Scaling in an SoC World" Intel Logic Technology Development; ISSCC; 2009; 66 Pages.
Dusa, Mircean et al., "Pitch Doubling Through Dual Patterning Lithography Challenges in Integration and Litho Budgets," Optical Microlithography XX, vol. 6520, 65200G, (2007); 10 pages.
U.S. Office Action dated Oct. 5, 2015 issued in U.S. Appl. No. 14/576,020.
Blain et al. (Jul./Aug. 1996) "Role of nitrogen in the downstream etching of silicon nitride," Journal of Vacuum Science & Technology A, 14(4):2151-2157.
Blain (Mar./ Apr. 1999) "Mechanism of nitrogen removal from silicon nitride by nitric oxide," Journal of Vacuum Science & Technology A, 17(2):665-667.
Kastenmeier et al. (Nov./Dec. 1999) "Highly selective etching of silicon nitride over silicon and silicon dioxide," J. Vac. Sci. Techno!. A, American Vacuum Society, I7 (6):3179-3184.
Kastenmeier et al. (Sep./Oct. 1996) "Chemical dry etching of silicon nitride and silicon dioxide using CF4/02/N2 gas mixtures," J. Vac. Sci. Technol. A14(5):2802-2813.

(56) References Cited

OTHER PUBLICATIONS

Oehrlein et al. (1996) "Study of plasma-surface interactions: chemical dry etching and high-density plasma etching," Plasma Sources Sci. Technol. 5:193-199.
Tajima et al. (2013) "Room-Temperature Si Etching in NO/F2 Gases and the Investigation of Surface Reaction Mechanisms," The Journal of Physical Chemistry C, 117:5118-5125.
Yun et al. (2007) "Large Etch Rate Enhancement by NO-Induced Surface Chemical Reaction during Chemical Dry Etching of Silicon Oxide in F2 Remote Plasmas," Journal of The Electrochemical Society, 154(4):D267-D272.
US Final Ofice Action dated Feb. 26, 2016 issued in U.S. Appl. No. 14/576,020.
US Office Action dated Sep. 23, 2016 issued in U.S. Appl. No. 14/576,020.
European Extended Search Report dated May 30, 2016 issued in EP 15 199 363.1.
U.S. Appl. No. 62/106,407, filed Jan. 22, 2015, in the names of Joseph Yudovsky et al., & entitled "Injector for Spatially Separated Atomic Layer Deposition Chamber" pp. 1-68. (Year: 2015).
U.S. Appl. No. 62/065,497, entitled "Gas Supply Delivery Arrangement Including a Gas Splitter for Tunable Gas Flow Control," filed Oct. 17, 2014, in the names of Mark Taskar et al. (Year: 2014).
First Chinese Office Action for Chinese Application No. 201710013856.6 dated Oct. 21, 2019.
First Chinese Office Action for Chinese Application No. CN201710076420.1 issued Dec. 17, 2019. No translation provided. 11 pages.
First Office Action corresponding to Japanese Application No. 2018-186353, dated Jan. 21, 2020, 8 pages.
First Office Action corresponding to Japanese Application No. 2016-004302, dated Jan. 28, 2020, 4 pages.
First Office Action corresponding to Tiawanese Application No. 106104190, dated Sep. 4, 2020, 5 pages.
Office Action issued in corresponding Japanese Patent Application 2016-143886 dated Sep. 8, 2020.
Translation of First Office Action dated Sep. 28, 2020 corresponding to Korean Patent Application No. 10-2018-0114808, 3 pages.
Translation of Notification of Examination Opinions corresponding to Taiwanese Patent Application No. 106101332 dated Nov. 19, 2020, 9 pages.
D. A. Jobson. "On the Flow of a Compressible Fluid through Orifices." Proceedings of the Institution of Mechanical Engineers. 169[1](1955). pp. 767-776. https://doi.org/10.1243/PIME_PROC_1955_169_077_02 (Year: 1955).
Cashco, Inc. "Fluid Flow Basics ofThrottling Valves." 1999. pp. 1-56. Available Mar. 24, 2020 online at: https://www.controlglobal.com/assets/Media/MediaManager/RefBook_Cash co Fluid. pdf. (Year: 1999).
O'Keefe Controls Co. "Choked Flow of Gases." in Catalog 11. 2003. pp. 20-24 & 48. (Year: 2003).
Christophe Corre. "Lecture 5: Quasi-1 D compressible Flows" in "Fundamentals of Compressible and Viscous Flow Analysis—Part II." 2018. pp. 94-148. Ecole Centrale de Lyon. Fluid Mechanics and Acoustics Laboratory (LMFA ). http://lmfa.ec-lyon. (Year: 2018).
Notification of Examination Opinions corresponding to Taiwanese U.S. Appl. No. 10/512,352 dated Feb. 19, 2020, 5 pages.
First Office Action dated Mar. 17, 2020 corresponding to Chinese Patent Application 20170076027.2, 8 pages.
First Office Action with Translation dated Sep. 7, 2021 corresponding to Korean Patent Application No. 10-2017-0083210, 6 pages.
First Office Action with Translation dated Oct. 7, 2021 corresponding to Japanese Patent Application No. 2017-154893, 7 pages.
Notification of Search Report corresponding to Singapore Patent Application No. 10201808035Y dated Oct. 20, 2022, 11 pages.
Office Action dated May 29, 2023 from Korean Patent Office for Korean Patent Application No. 10-2021-0079769; 8 pages.
International Search Report and Written Opinon for PCT Applicaiton No. PCT/US2019/045085 dated Dec. 20, 2019.
International Search Report and the Written Opinion of the ISA issued in PCT/US2017/061080, mailed Feb. 22, 2018; ISA/KR.
International Search Report and Written Opinion issued in PCT/US2017/043527, mailed Apr. 20, 2018; ISA/KR.
International Search Report and Written Opinion issued in PCT/US2017/062769, mailed Aug. 21, 2018; ISA/KR.
Search Report dated Sep. 7, 2020 corresponding to European Application No. 17 919 402.2, 9 pages.
Machine Translation of Notice of Reasons for Refusal corresponding to Japanese Patent Application No. 2019-559033 dated Dec. 22, 2020, 4 pages.
Translation of Written Opinion corresponding to Singapore Application No. 11201907515W dated Mar. 15, 2020, 4 pages.
Translation of Notification of Examination Opinions dated May 4, 2020 corresponding to Taiwanese Patent Application No. 106142110, 7 pages.
Translation of Notification of Office Action dated Dec. 17, 2019 corresponding to Korean Patent Application No. 10-2018-7021511, 2 pages.
Translation of Notification of Office Action dated Jun. 26, 2020 corresponding to Korean Patent Application No. 10-2018-7021511, 2 pages.
Search Report dated Feb. 19, 2020 corresponding to European Application No. 17 932 862.0, 7 pages.
Office Action dated Dec. 1, 2020 corresponding to Japanese Application No. 2019-553416, 4 pages.
Translation of Decision of Refusal dated Feb. 3, 2021 corresponding to Taiwanese Patent Application No. 106142110, 4 pages.
Translation of Decision for Grant of Patent dated Jul. 28, 2020 corresponding to Korean Application No. 10-2018-7021879, 1 page.
Translation of Written Opinion corresponding to Singapore Application No. 11201908264Q dated Feb. 19, 2020, 7 pages.
Translation of Notification of Office Action dated Dec. 19, 2019 corresponding to Korean Patent Application No. 10-2018-7021879, 7 pages.
Translation of Notification of Office Action dated Mar. 29, 2020 corresponding to Korean Patent Application No. 10-2020-7004813, 3 pages.
Translation of Decision for Grant of Patent dated Feb. 24, 2021 corresponding to Korean Application No. 10-2020-7013289, 1 page.
Translation of Notification of Office Action dated Aug. 27, 2021 corresponding to Korean Patent Application No. 10-2021-7014539, 8 pages.
Decision for Grant of Patent for Korean Application No. 10-2021-7014539 dated Feb. 23, 2022.
Notice of Reasons for Refusal for Japanese Application No. 2021-75777 dated Jul. 12, 2022.
International Search Report and Written Opinion of the ISA issued in PCT/US2020/044168, mailed Nov. 17, 2020; ISA/KR.
International Search Report and Written Opinion of the ISA issued in PCT/US2020/024333, mailed Dec. 24, 2020; ISA/KR.
International Search Report and Written Opinion of the ISA issued in PCT/US2021/052732, mailed Jan. 21, 2022; ISA/KR.
Supplementary Partial European Search Report issued in corresponding European Patent Application No. 20850609 dated MAug. 3, 2023.
Taiwanese Office Action for Taiwanese Application No. 110126786 dated Oct. 16, 2023.
Korean Notice of Preliminary Examination Result for Korean Application No. 10-2023-7037853 dated Dec. 6, 2023.
Taiwanese Office Action for Taiwanese Application No. 109109974 dated Jan. 4, 2024.
Examination Report issued in corresponding European Patent Application 18929891.2 dated Jul. 3, 2023.
Taiwanese Office Action for Taiwanese Application No. 111104002 dated Mar. 8, 2023.
Notice of Reason for Refusal issued in corresponding Japanese patent application No. 10- 2018-7028683.
European Extended Search Report dated Jun. 6, 2022 issued in EP 18929891.2.

(56) References Cited

OTHER PUBLICATIONS

Notice of Reason for Refusal issued in corresponding Japanese patent application No. 2019-505020 dated Jan. 27, 2023.
Notice of Reason for Refusal issued in corresponding Japanese patent application No. 2019-505020 dated Jun. 20, 2023.
Office Action issued in corresponding Korean Patent Application No. 10-2018-7028683 dated Jan. 26, 2023.
Office Action issued in corresponding Korean Patent Application 10-2018-7028683 dated May 2, 2023.
Office Action issued in corresponding Korean Patent Application 10-2021-7027521 dated Dec. 20, 2023.
Office Action dated Oct. 10, 2023 from Korean Patent Office for Korean Patent Application No. 10-2023-7023024.
U.S. Appl. No. 16/487,703, filed Aug. 21, 2019.
U.S. Appl. No. 16/497,091, filed Sep. 24, 2019.
U.S. Appl. No. 16/960,818, filed Jul. 8, 2020.
U.S. Appl. No. 17/181,571, filed Feb. 22, 2021.
U.S. Appl. No. 17/631,984, filed Feb. 1, 2022.
U.S. Appl. No. 17/633,727, filed Feb. 8, 2022.
U.S. Appl. No. 17/671,211, filed Feb. 14, 2022.
U.S. Appl. No. 17/681,606, filed Feb. 25, 2022.
U.S. Appl. No. 17/913,008, filed Sep. 20, 2022.
U.S. Appl. No. 17/631,984, filed Feb. 1, 2022, Han et al.
U.S. Appl. No. 18/029,708, filed Mar. 31, 2023, Kimball et al.
U.S. Appl. No. 17/181,571, filed Feb. 22, 2021, Yan et al.
U.S. Appl. No. 17/633,727, filed Feb. 8, 2022, Mishra et al.
U.S. Appl. No. 17/913,008, filed Sep. 20, 2022, Han et al.
U.S. Appl. No. 17/671,211, filed Feb. 14, 2022, Kimball et al.
U.S. Appl. No. 16/497,091, filed Sep. 24, 2019, Rathnasinghe et al.
U.S. Appl. No. 16/487,703, filed Aug. 21, 2019, Rathnasinghe et al.
U.S. Appl. No. 17/681,606, filed Feb. 25, 2022, Rathnasinghe et al.
U.S. Appl. No. 17/681,633, filed Feb. 25, 2022, Rathnasinghe et al.
Office Action issued in corresponding Korean Patent Application 1020170013979 dated May 29, 2024.
Allowanced issued in corresponding Korean Application No. 1020170018561 dated Jan. 15, 2025.
Taiwanese Office Action for Taiwanese Application No. 110136825 dated Jan. 16, 2025.
Decision to Grant a Patent in Japanese Application No. 20220264247, dated Feb. 25, 2025.
International Search Report and Written Opinion of the ISA issued in PCT/US2020/044816, mailed Nov. 13, 2020; ISA/KR.
Search Report from corresponding Singaporean Application No. 11202201065W, dated May 28, 2024.
Office Action from corresponding Korean Application No. 10-2023-7037449, dated Jul. 22, 2024.
Taiwanese Office Action from corresponding Taiwanese Application No. 109126470 dated Jun. 28, 2024.
Extended European Search Report from corresponding European Application No. 22156901.5 dated Jun. 27, 2022.
Decision to Grant for Japanese Application No. 2024-75662 dated Mar. 27, 2025.
Office Action from corresponding Chinese Application No. 202210228466.1, dated Oct. 30, 2024.
Office Action from corresponding Taiwanese Application No. 112149171, dated Nov. 13, 2024.
International Search Report and Written Opinion of the ISA issued in PCT/US2022/043617, mailed Mar. 30, 2023; ISA/KR.
Chinese Office Action for Chinese Application No. 202080057245.1 dated Oct. 17, 2024.
Japanese Office Action for Japanese Application No. 2023-129731 dated Sep. 10, 2024.
Decision to Grant for Japanese Application No. 2023-11469 dated Apr. 10, 2024.
Office Action from corresponding Korean Application No. 10-2022-7007791, dated Jul. 22, 2024.
Search Report from corresponding Korean Application No. 10-2023-7037449, dated Nov. 16, 2023.
Japanese Office Action and Search Report for Japanese Application No. 2022-508752 dated Jul. 25, 2024.
Korean Decision for Grant of Patent for Korean Application No. 10-2023-7035339 dated Jul. 30, 2024.
European Examination Report for European Application No. 21161965.5 dated Jul. 27, 2023.
Extended European Search Report from European Application No. 22156901.5 dated Jun. 27, 2022.
First Office Action from Corresponding Taiwanese Application No. 109126470 dated Jun. 28, 2024.
Decision to Grant for Japanese Application No. 2022-557679 dated Feb. 28, 2024.
Office Action from corresponding Korean Application No. 10-2022-7007496 dated Aug. 21, 2024.

* cited by examiner

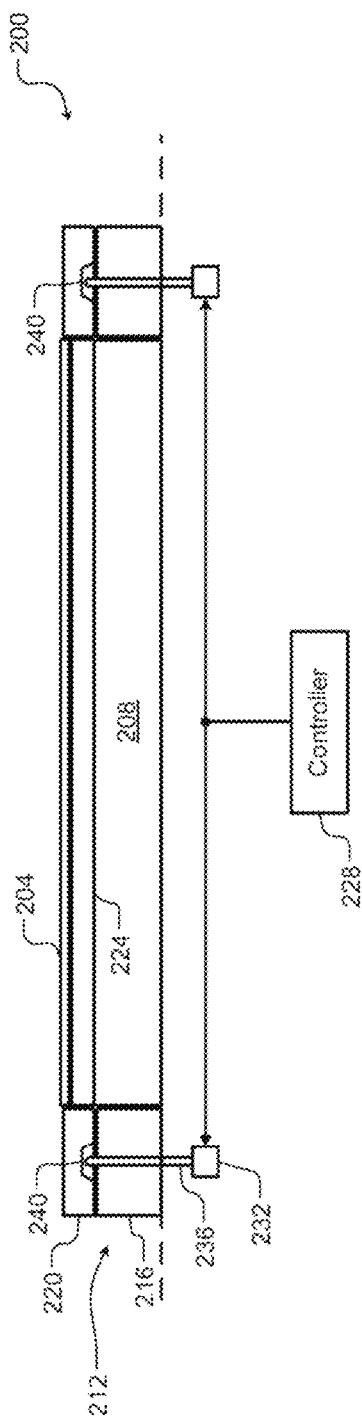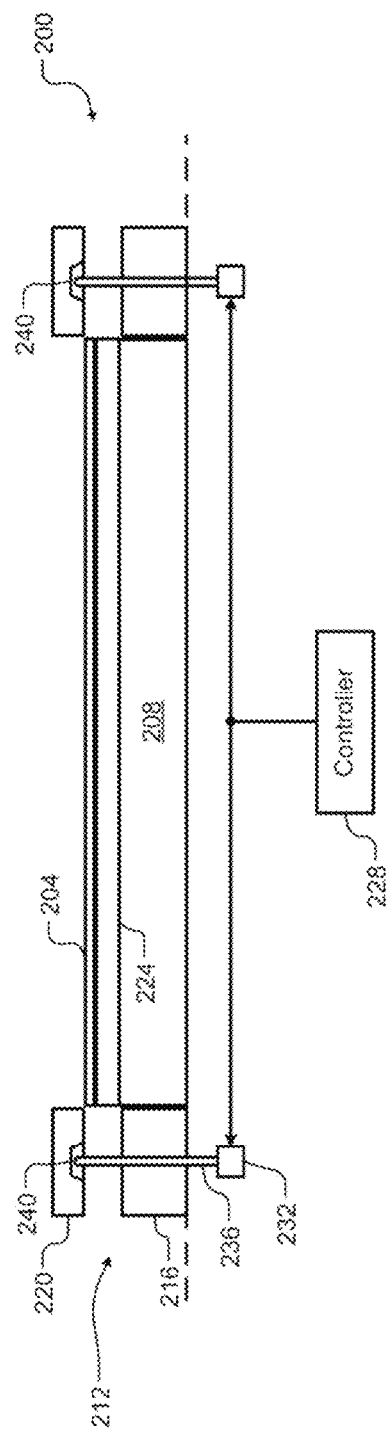

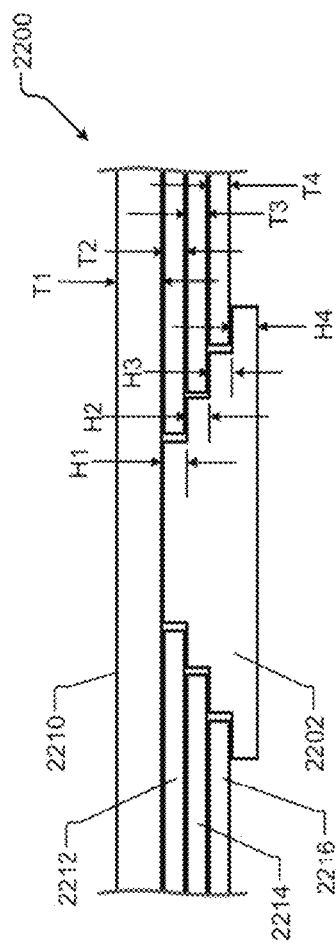
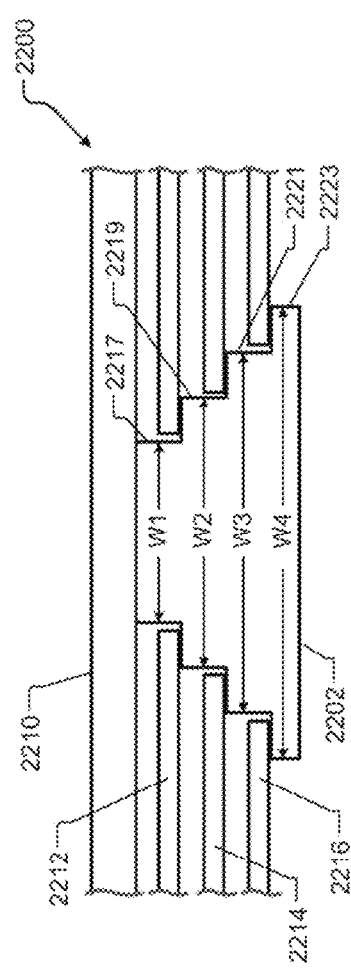
FIG. 22A
FIG. 22B

EDGE RINGS PROVIDING KINEMATIC COUPLING AND CORRESPONDING SUBSTRATE PROCESSING SYSTEMS

CROSS-REFERENCE TO RELATED APPLICATIONS

This application is a continuation of U.S. patent application Ser. No. 16/960,818, filed on Jul. 8, 2020, which is a 371 U.S. National Phase of International Application No. PCT/US2018/050273, filed on Sep. 10, 2018, which claims the benefit of U.S. Provisional Application No. 62/718,112, filed on Aug. 13, 2018. The entire disclosures of the applications referenced above are incorporated herein by reference.

FIELD

The present disclosure relates to moveable edge rings in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

The substrate support may include a ceramic layer arranged to support a wafer. For example, the wafer may be clamped to the ceramic layer during processing. The substrate support may include an edge ring arranged around an outer portion (e.g., outside of and/or adjacent to a perimeter) of the substrate support. The edge ring may be provided to confine plasma to a volume above the substrate, protect the substrate support from erosion caused by the plasma, shape and position a plasma sheath, etc.

SUMMARY

A first edge ring for a substrate support is provided. The first edge ring includes an annular-shaped body and one or more lift pin receiving elements. The annular-shaped body is sized and shaped to surround an upper portion of the substrate support. The annular-shaped body defines an upper surface, a lower surface, a radially inner surface, and a radially outer surface. The one or more lift pin receiving elements are disposed along the lower surface of the annular-shaped body and sized and shaped to receive and provide kinematic coupling with top ends respectively of three or more lift pins.

In other features, the collapsible edge ring assembly for a substrate support is provided. The collapsible edge ring assembly includes edge rings and three or more alignment and spacing elements. The edge rings are arranged in a stack. At least one of the edge rings is shaped and sized to surround an upper portion of the substrate support. The edge rings include a top edge ring and at least one intermediate edge ring. The three or more ring alignment and spacing elements contact each of the edge rings and are configured to maintain radial alignment and vertical spacing of the edge rings. The three or more ring alignment and spacing elements are configured to lift the at least one intermediate edge ring while the top edge ring is lifted.

In other features, a collapsible edge ring assembly for a substrate support is provided. The collapsible edge ring assembly includes multiple edge rings and a stepped outer edge ring. The edge rings are arranged in a stack. At least one of the edge rings is shaped and sized to surround an upper portion of the substrate support. The edge rings include a top edge ring and at least one intermediate edge ring. The stepped outer edge ring includes levels. The edge rings are disposed respectively on the levels. The stepped outer edge ring is configured to maintain radial alignment and vertical spacing of the plurality of edge rings. The stepped outer edge ring is configured to lift the at least one intermediate edge ring while the top edge ring is lifted.

BRIEF DESCRIPTION OF THE DRAWINGS

The present disclosure will become more fully understood from the detailed description and the accompanying drawings, wherein:

FIG. 2A is a cross-sectional side view of an example of a moveable edge ring having a lift pin receiving element in accordance with an embodiment of the present disclosure;

FIG. 2B is a cross-sectional side view of the moveable edge ring of FIG. 2A in a raised position;

FIG. 22A is a cross-sectional side view of an example of a portion of another collapsible edge ring assembly including a ring alignment and spacing element that is inner disposed and in a collapsed state in accordance with an embodiment of the present disclosure;

FIG. 22B is a cross-sectional side view of the portion of the collapsible edge ring assembly of FIG. 22A, where the ring alignment and spacing element is in an expanded state;

In the drawings, reference numbers may be reused to identify similar and/or identical elements.

DETAILED DESCRIPTION

Figure 1:
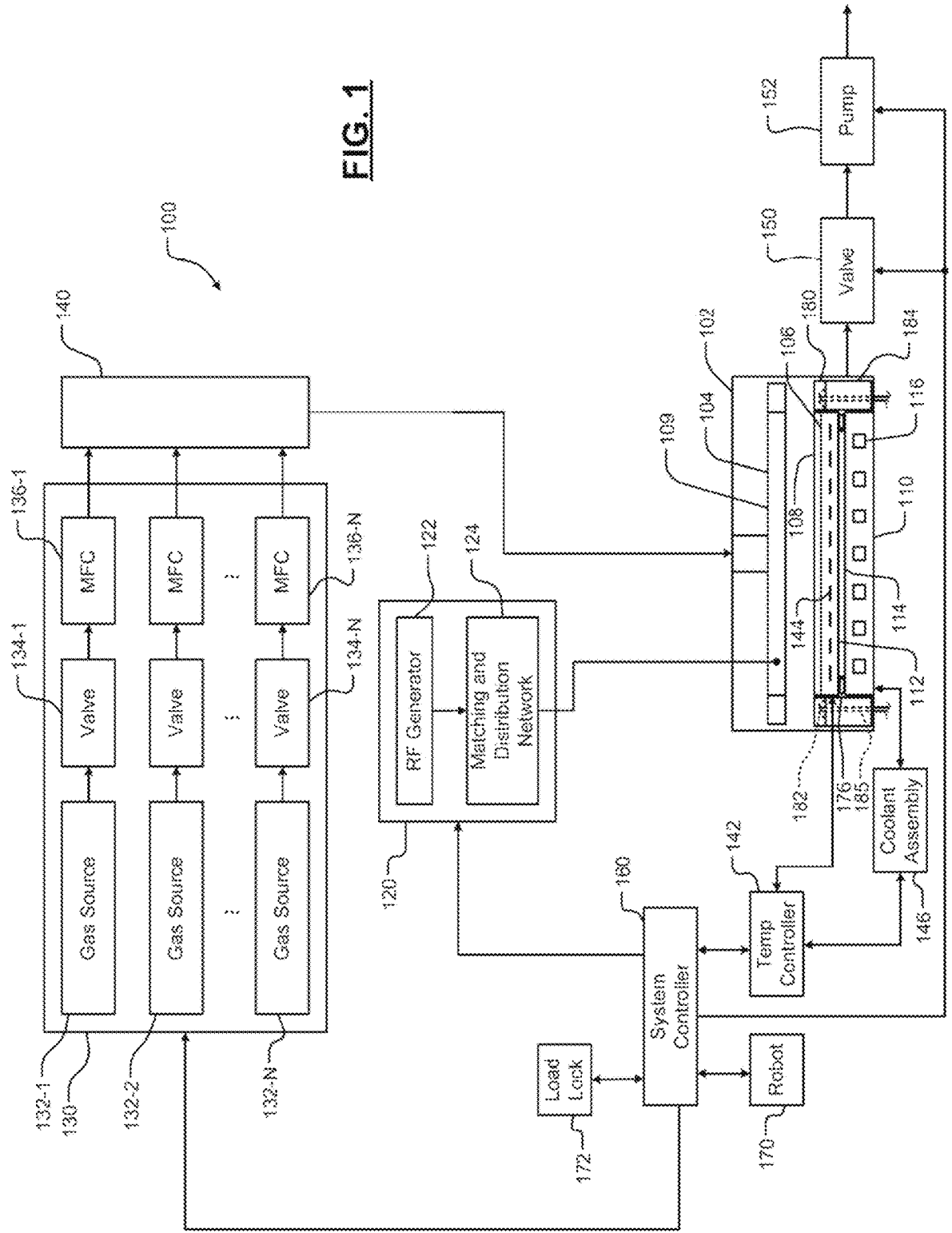
FIG. 1 is a functional block diagram of an example of a substrate processing system including an edge ring assembly in accordance with an embodiment of the present disclosure.

A substrate support in a substrate processing system may include an edge ring. An upper surface of the edge ring may extend above an upper surface of the substrate support, causing the upper surface of the substrate support (and, in some examples, an upper surface of a substrate (or wafer) arranged on the substrate support) to be recessed relative to the edge ring. This recess may be referred to as a pocket. A distance between the upper surface of the edge ring and the upper surface of the substrate may be referred to as a "pocket depth." The pocket depth may be fixed according to a height of the edge ring relative to the upper surface of the substrate.

Some substrate processing systems may implement a moveable (e.g., tunable) and/or replaceable edge ring. In one example, a height of the edge ring may be adjusted during processing to control etch uniformity, shape of a plasma sheath, and an ion tilt angle. An actuator raises and lowers the edge ring. In one example, a controller of the substrate processing system controls operation of the actuator to adjust a height of the edge ring during a process and according to a particular recipe being performed and associated gas injection parameters.

Edge rings and other corresponding components may include consumable materials that wear/erode over time. Accordingly, the heights of the edge rings may be adjusted to compensate for erosion. The edge rings may be removable and replaceable to be replaced when in an eroded and/or damaged state such that the edge rings have unusable geometries. The term "removable" as used herein refers to the ability of an edge ring to be removed from a processing chamber while under vacuum using, for example, a vacuum transfer arm. The edge ring may be lifted via lift pins to a height at which the vacuum transfer arm is able to move the edge ring out of the corresponding processing chamber and replace the edge ring with another edge ring.

Edge rings can have flat bottom surfaces, which contact top ends of lift pins when placed on the lift pins. Placement on lift pins can vary for a single edge ring and can be different for different edge rings. For example, a first edge ring may be placed relative to the lift pins such that the lift pins contact the first edge ring at first points. The lift pins may be raised and lowered multiple times throughout a lifecycle of the first edge ring. The positions of the contact points may vary due to, for example, plasma erosion over time of the first edge ring, horizontal movement of the first edge ring, etc. As a result, relative positioning of the first edge ring relative to a corresponding substrate support and a substrate being processed is different. This can affect processing of the substrate.

As another example, the first edge ring may be replaced with a second edge ring. The second edge ring may have the same dimensions as the first edge ring when the first edge ring was new and unused. The second edge ring may be placed relative to the lift pins such that the lift pins contact the second edge ring at second points. The second points may be different than the first points. As a result, relative positioning of the second edge ring relative to a corresponding substrate support and a substrate being processed is different than that of the first edge ring, which can affect processing of the substrate.

Examples set forth herein include replaceable and/or collapsible edge ring assemblies (hereinafter "the assemblies") for plasma sheath tuning that include features for predictable, repeatable and consistent positioning of edge rings such that lift pins contact the edge rings at the same locations. This is true for a single edge ring that is raised and lowered multiple times during multiple processes such that lift pins are moved into contact with the edge ring and moved away from the edge ring multiple times. This also holds true for different edge rings, where for example, a first edge ring is replaced with a second edge ring.

The assemblies include edge ring positioning, alignment and centering features, such as kinematic coupling features, stabilizing features, chamfered surfaces, beveled surfaces, stepped lift pins, lift pin sets allocated for respective edge rings, etc. The kinematic coupling features include grooves, pockets, notches, and/or other lift pin receiving and/or recessed portions of edge rings for receiving lift pins. In some of the examples, the assemblies (also referred to as "kits") include multiple stacked edge rings that are arranged and held in alignment via ring alignment and spacing elements. The stabilizing features include stabilizing edge rings, springs, etc.

As used herein, the phrase "kinematic coupling" refers to the use of lift pin receiving elements having constraining features, which constrain the lateral movement of corresponding edge rings. Kinematic coupling does not refer to confining features or features that simply limit movement in a lateral direction. As an example, kinematic coupling may be provided by one or more lift pin receiving elements. A groove may be shaped and sized to contact one or more lift pins. For example, a linear groove may contact, for example, one or two lift pins, whereas a circular groove may contact three lift pins. The constraining features include surfaces of the lift pin receiving elements, for example, surfaces of a V-shaped groove, which contact a corresponding lift pin at two lift pin contact points. Each lift pin contacts one of the lift pin receiving elements at two contact points.

As an example, an edge ring is laterally constrained when the edge ring has three lift pin receiving elements, where each of the lift pin receiving elements contacts a respective lift pin at two contact points. In this example, each of the lift pin receiving elements does not contact the respective lift pin at more than two contact points. Kinematic coupling is not, however, limited to this example. An alternative technique to achieve the same effect involves three lift pins, one which contacts the edge ring at precisely three points (a cone or a pyramid shaped divot), a second which contacts the edge ring at precisely two points (V-Groove), and a third which makes a single point of contact. Other similar techniques exist. The end effect of each example technique is the same as each technique constrains the edge ring with precision by making a total of 6 points of contact to achieve complete control of all 6 degrees of freedom (X, Y, Z, pitch, roll, and yaw). Note that constraining is different than confining. An edge ring may be confined if, for example, the edge ring includes three cube-shaped notches configured to receive three lift pins. A width of the cube-shaped notches may be larger than diameters of the lift pins such that a gap exists between the lift pins and the cube-shaped notches. The edge ring may be confined (or limited in lateral movement), but is not constrained.

FIG. 1 shows a substrate processing system 100, which, as an example, may perform etching using RF plasma and/or perform other substrate processing operations. The substrate processing system 100 includes a processing chamber 102 that encloses some of the components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, implements remote plasma generation and delivery (e.g., using a plasma tube, a microwave tube), etc.

For example only, the upper electrode 104 may include a gas distribution device such as a showerhead 109 that introduces and distributes process gases (e.g., etch process gases). The showerhead 109 may include a stem portion including one end connected to a top surface of the processing chamber 102. A base portion is generally cylindrical and extends radially outwardly from an opposite end of the stem portion at a location that is spaced from the top surface of the processing chamber 102. A substrate-facing surface or faceplate of the base portion of the showerhead 109 includes holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer (or top plate) 112. In some examples, the ceramic layer 112 may include a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more gases (e.g., etch gas, carrier gases, purge gases, etc.) and mixtures thereof. The gas sources may also supply purge gas. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may control power to the heating elements 144 to control a temperature of the substrate support 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the thermal resistance layer 114 between the ceramic layer 112 and the baseplate 110.

The substrate support 106 includes an edge ring 180. The edge rings disclosed herein are annularly-shaped including the edge ring 180. The edge ring 180 may be a top ring, which may be supported by a bottom ring 184. In some examples, the edge ring 180 may be further supported by one or more middle rings (not shown in FIG. 1) and/or other portions of the substrate support 106. The edge ring 180 may include pin receiving elements 182 that receive top ends of lift pins 185. Examples of the lift pin receiving elements 182 and corresponding edge rings and ring alignment and spacing elements are described below with respect to at least FIGS. 2A-26.

The edge ring 180 is moveable (e.g., moveable upward and downward in a vertical direction) relative to the substrate 108. For example, the edge ring 180 may be controlled via an actuator responsive to the controller 160. In some examples, the edge ring 180 may be vertically moved during substrate processing (i.e., the edge ring 180 may be tunable). In other examples, the edge ring 180 may be removable using, for example, the robot 170, via an airlock, while the processing chamber 102 is under vacuum. In still other examples, the edge ring 180 may be both tunable and removable. In other embodiments, the edge ring 180 may be implemented as a collapsible edge ring assembly, as further described below.

FIGS. 2A and 2B show an example substrate support 200 having a substrate 204 arranged thereon is shown. The substrate support 200 may include a base or pedestal having an inner portion (e.g., corresponding to an ESC) 208 and an outer portion 212. In examples, the outer portion 212 may be independent from, and moveable in relation to, the inner portion 208. For example, the outer portion 212 may include a bottom ring 216 and a top edge ring 220. The substrate 204 is arranged on the inner portion 208 (e.g., on a ceramic layer (or top plate) 224) for processing. A controller 228 controls operation of one or more actuators 232 to selectively raise and lower the edge ring 220. For example, the edge ring 220 may be raised and/or lowered to adjust a pocket depth of the support 200 during processing. In another example, the edge ring 220 may be raised to facilitate removal and replacement of the edge ring 220.

For example only, the edge ring 220 is shown in a fully lowered position in FIG. 2A and in a fully raised position in FIG. 2B. As shown, the actuators 232 correspond to pin actuators configured to selectively extend and retract lift pins 236 in a vertical direction. For example only, the edge ring 220 may be formed of ceramic, quartz and/or other suitable materials (e.g., silicon carbide, yttria, etc.). In FIG. 2A, the controller 228 communicates with the actuators 232 to directly raise and lower the edge ring 220 via the lift pins 236. In some examples, the inner portion 208 is moveable relative to the outer portion 212.

Figure 6:
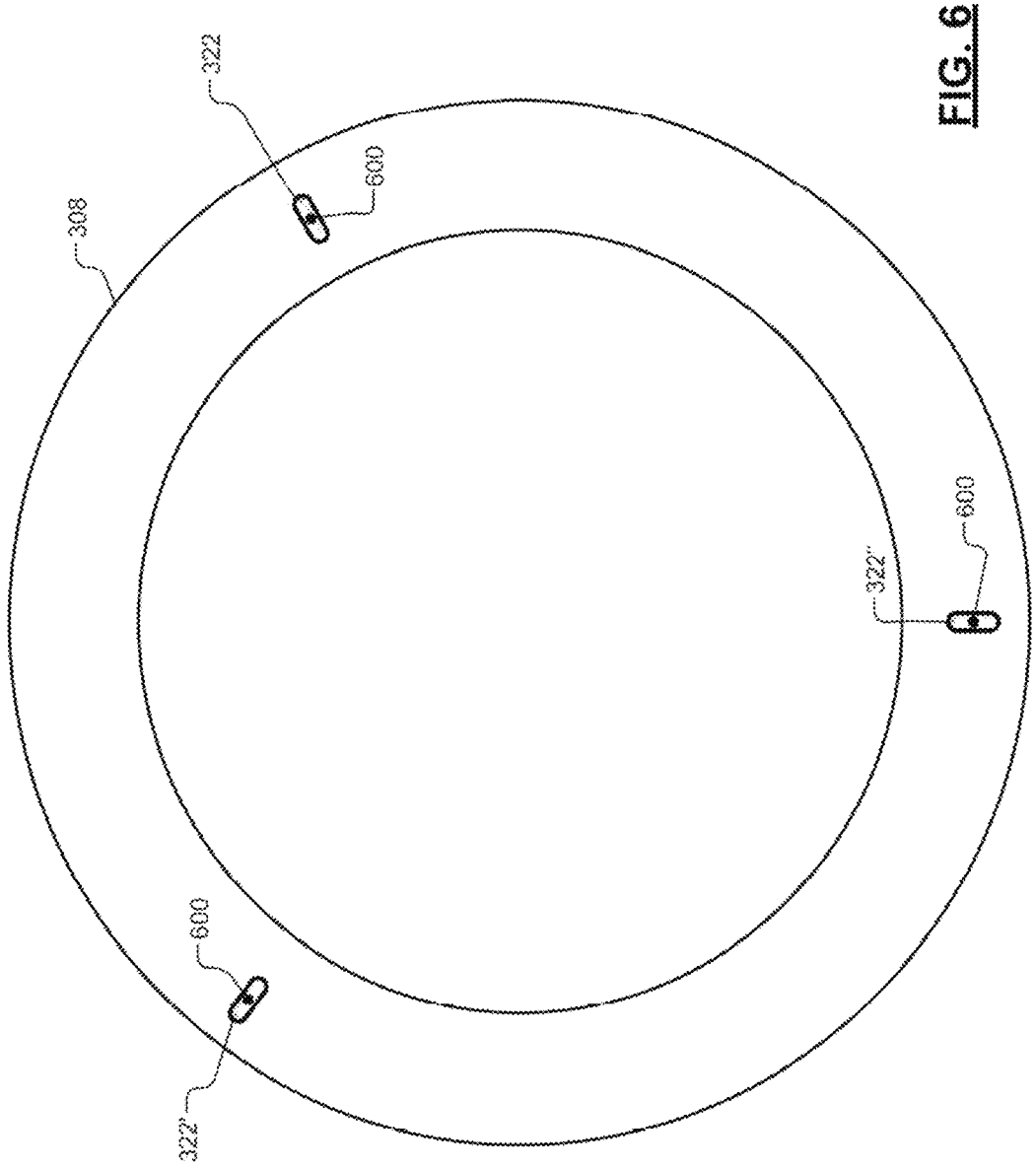
FIG. 6 is a bottom view of an example of a top edge ring having multiple lift pin receiving elements with respective V-shaped grooves in accordance with an embodiment of the present disclosure.

The edge ring 220 includes lift pin receiving elements 240 that receive top ends of the lift pins 236. The edge ring 220 may include one or more lift pin receiving elements for receiving three or more lift pins. In one embodiment, the edge ring 220 includes three lift pin receiving elements that receive respectively three lift pins. The three lift pin receiving elements may be disposed 120° apart from each other (an example of this arrangement is shown in FIG. 6). The lift pin receiving elements 240 may include grooves, divots, pockets, notches, recessed regions, and/or other suitable lift pin receiving elements. The contact between the lift pin receiving elements 240 and the lift pins provides kinematic coupling which positions the edge ring 220 on the lift pins and maintains a position of the edge ring 220 in horizontal (or lateral) directions (e.g., in X and Y directions) and vertical directions (e.g., Z directions). This provides an anti-walk feature. Edge ring "walking" refers to positional drift of a top edge ring relative to a substrate being processed over time, which leads to a drift in extreme edge (EE) uniformity.

The anti-walk feature aids in preventing the substrate 204 from moving horizontally: when unclamped (or floating) on the substrate support 200; during thermal cycling; when thermal differences associated with differing coefficients of thermal expansion exist; poor de-chucking of a substrate; and/or during vibration events. Examples of the lift pin receiving elements are shown in at least FIGS. 3A-13, 15-21 and 25. When the edge ring 220 is raised for tuning during processing as described above, the controller 228 is configured to control a tunable range of the edge ring 220. In other words, the edge ring 220 may be raised from a fully lowered position (e.g., 0.0 inches (")) to a fully raised position (e.g., 0.25"). The lift pins 236 may be raised a predetermined amount (e.g., 0.050") from an initial position before coming in contact with the edge ring 220.

Figure 3B:
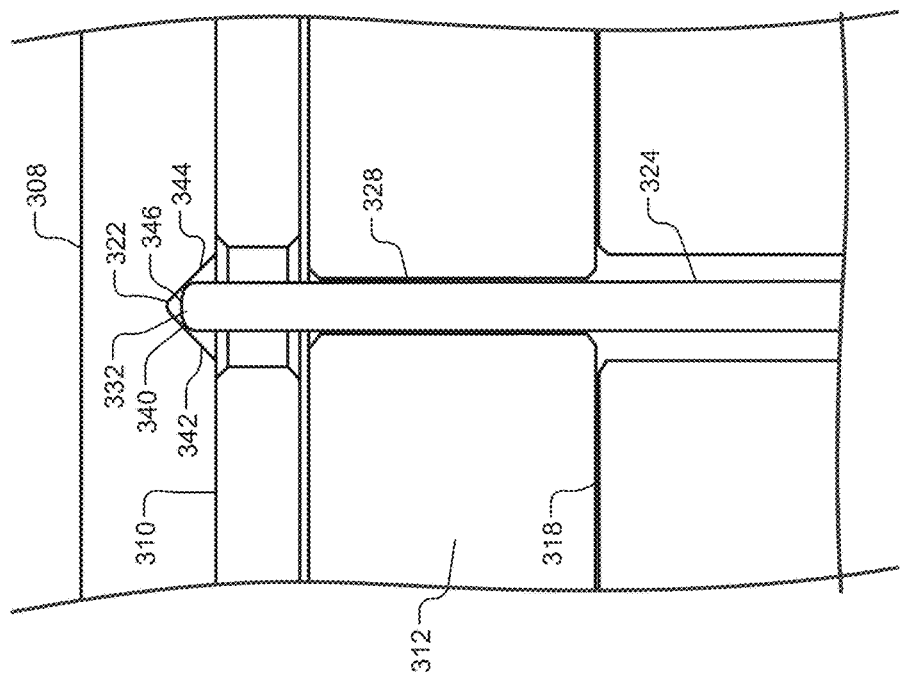
FIG. 3B is an azimuthal cross-sectional view through section line A-A of FIG. 3A.
Figure 3A:
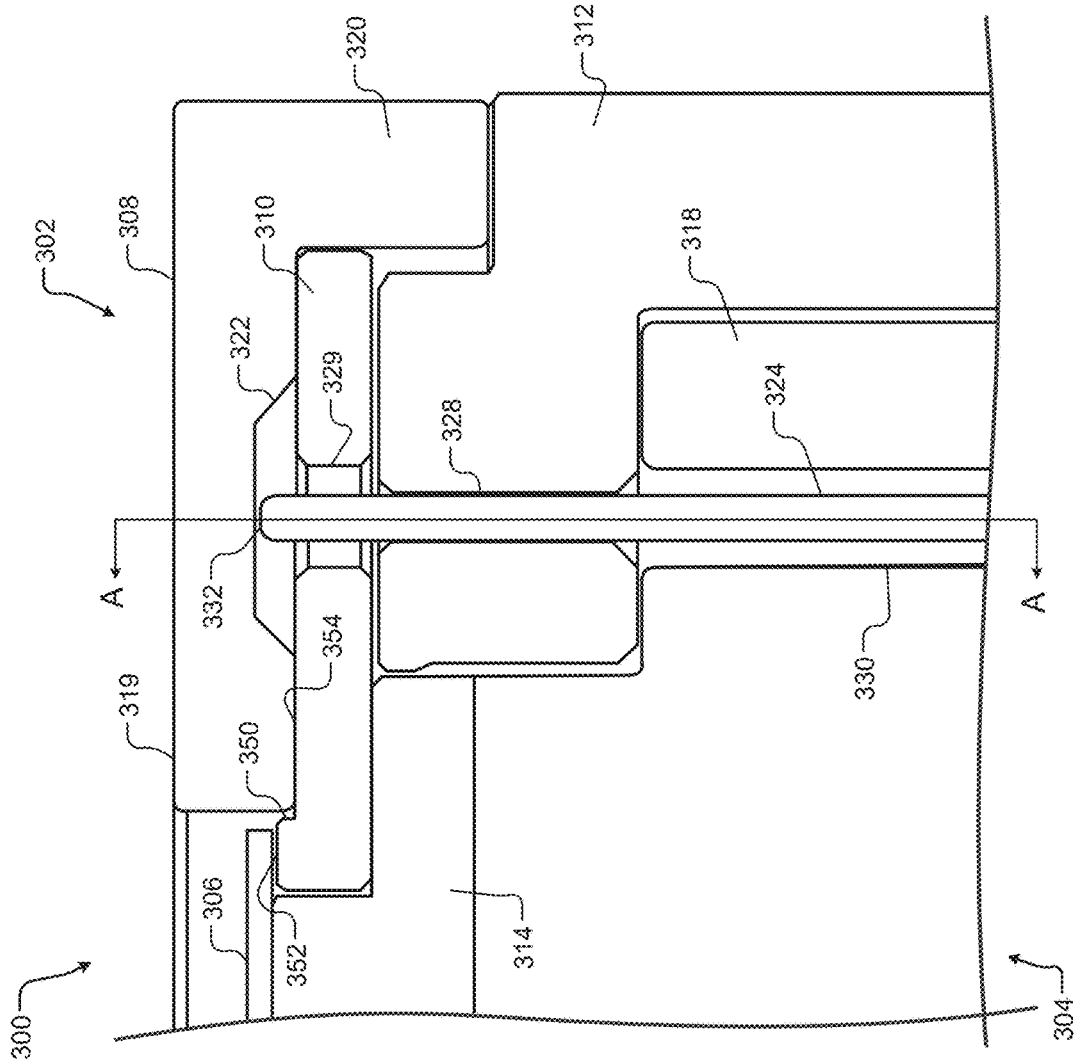
FIG. 3A is a radial cross-sectional view of an example of a portion of an edge ring assembly, a substrate support and a substrate in accordance with an embodiment of the present disclosure.

FIGS. 3A and 3B show a portion 300 of an edge ring assembly 302, a substrate support 304 and a substrate 306. The edge ring assembly 302 may include a top edge ring 308, a middle edge ring 310 and a bottom edge ring 312. The substrate support 304 may include a top plate 314 and a baseplate 318.

The top edge ring 308 is cupped with a top member 319 and an outer flange 320, which extends downward from the top member 319. The top member 319 includes lift pin receiving elements (one lift pin receiving element 322 is shown). The lift pin receiving element 322 is located on a bottom side of the top member 319 and faces a lift pin 324, which extends through the baseplate 318, a hole 328 in the bottom edge ring 312, and a hole 329 in the middle edge ring 310. The lift pin 324 extends through a hole 330 in the baseplate 318. The outer flange 320 protects the middle edge ring 310, an upper portion of the lift pin 324, an upper portion of the bottom edge ring 312, and a portion of the substrate support 304 from directly receiving and/or being in contact with plasma. This prevents erosion and increases life of the middle edge ring 310, the lift pin 324, the bottom edge ring 312 and the substrate support 304. Similarly, the bottom edge ring 312 protects a portion of the lift pin 324 and the baseplate 318 from direct exposure and/or contact with plasma. The hole 329 is oversized to prevent the lift pin 324 from contacting the middle edge ring 310.

A top end 332 of the lift pin 324 is received in the lift pin receiving element 322. The lift pin receiving element 322 may be, for example, a 'V'-shaped groove having half conically shaped (or quarter spherically shaped) ends. The 'V'-shape of the groove can be seen in FIGS. 3B, 4, 5 and 7. The top end 332 of the lift pin 324 may be hemispherically shaped or may have (i) a rounded edge portion 340 that contacts surfaces 342, 344 of the lift pin receiving element 322, and (ii) a flat top surface 346. The top end 332 is shaped such that two points of the lift pin 324 contact the lift pin receiving element 322 and no other portions of the lift pin 324. The top end 332 may have a flat top surface 346 to: increase ease in manufacturing the lift pin 324 and thus decrease manufacturing cost; increase yield; and/or prevent the top end 332 from contacting a vertex portion (or curved portion) of the lift pin receiving element 322. The vertex portion is identified with numerical designator 400 in FIG. 4. Contact between the top end 332 and the vertex portion 400 is referred to as "bottoming out" the lift pin 324 in the 'V'-shaped groove.

The middle edge ring 310 includes an instep 350 that transitions from a first top surface 352 to a second top surface 354. The substrate 306 is disposed on the first top surface 352. The top edge ring 308 is disposed on the second top surface 354. The second top surface 354 is at a lower level than the first top surface 352. The top edge ring 308 may be raised to a level higher than a level of the first top surface 352 and/or a level of a top surface of the substrate 306. As an example, the top edge ring 308 may be lifted 0.24"-0.60" relative to the middle edge ring 310. The top edge ring 308 may be lifted, for example, 0.15"-0.2" above the level of the top surface of the substrate 306. When the top edge ring 308 is in a fully down (or retracted) position, the substrate 306 is disposed radially inward of the top edge ring 308. When the top edge ring 308 is in a fully raised (or extended) position, the top edge ring 308 may be higher than the substrate 306. The instep 350 (i) aids in declamping the substrate 306 from the substrate support 304, (ii) aids in maintaining positioning of the top edge ring 308 including preventing the top edge ring from tilting relative to the substrate 306, and (iii) aids in preventing the substrate 306 from moving under the top edge ring 308 when, for example, the substrate 306 is not clamped to the substrate support 304.

Figure 5:
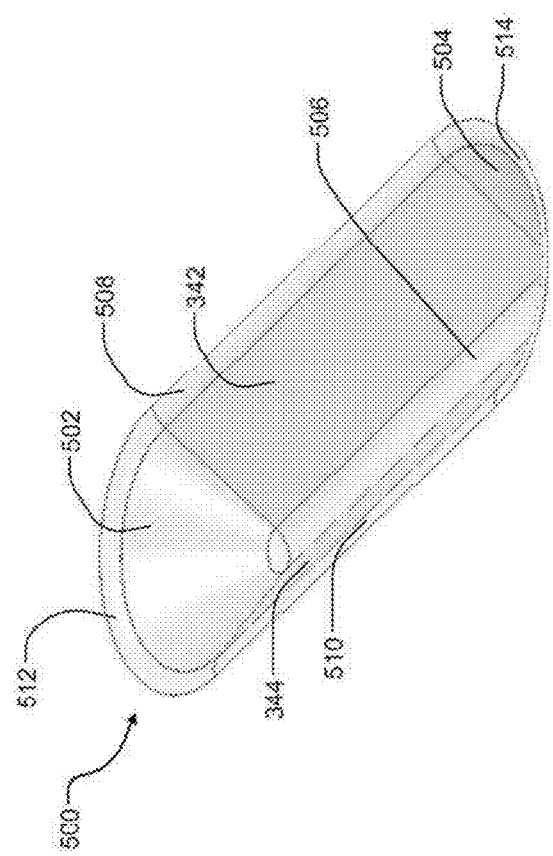
FIG. 5 is a perspective view of an example of a lift pin receiving element having a 'V'-shaped groove in accordance with an embodiment of the present disclosure.
Figure 7:
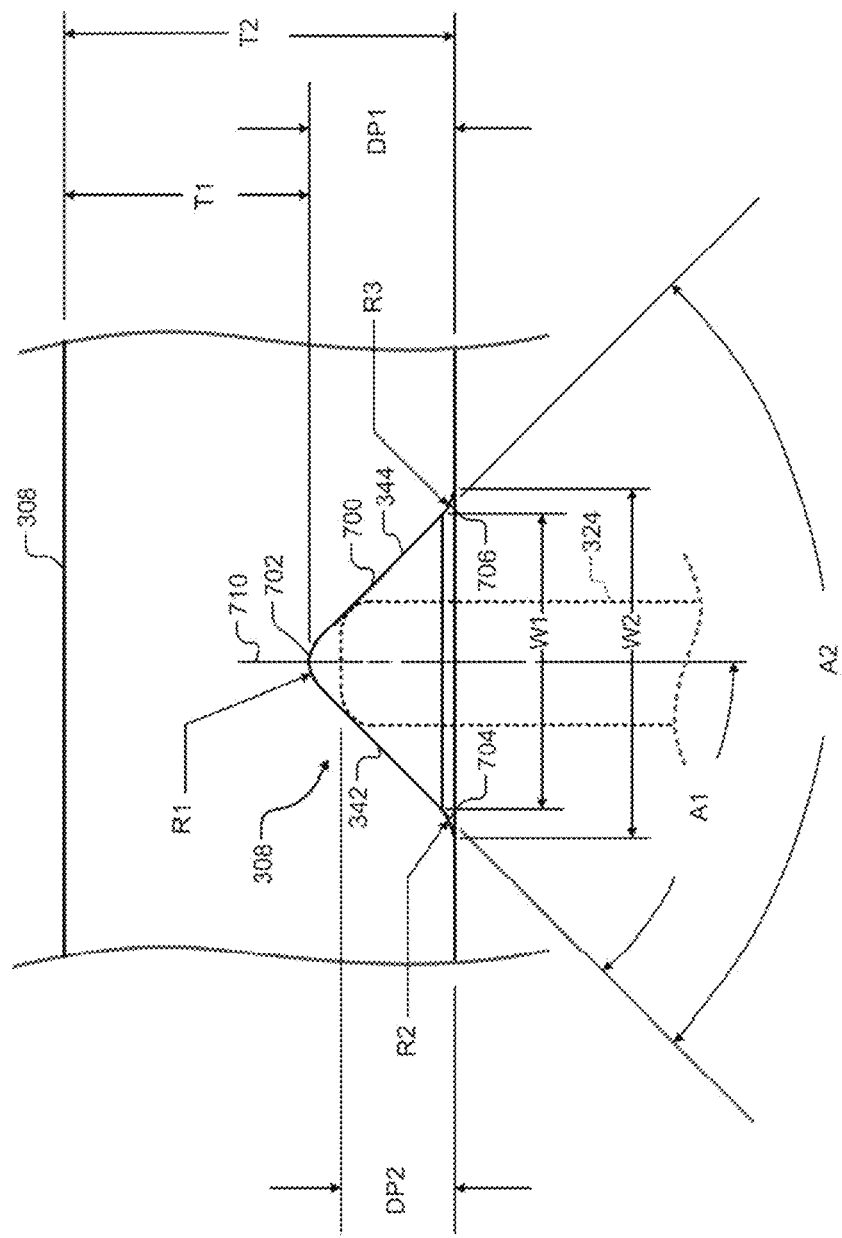
FIG. 7 is a cross-sectional side view of a portion of a top edge ring illustrating dimensions of a V-shaped groove in accordance with an embodiment of the present disclosure.

The top edge ring 308 may include one or more of the lift pin receiving elements 322, as shown in FIG. 6. This along with contact with corresponding lift pins provides kinematic coupling and anti-walk features. The top edge ring 308 is centered relative to the substrate support 304 based on the interaction between the lift pins and the lift pin receiving elements 322. If the top edge ring 308 is initially placed such that the lift pin receiving elements 322 are within a predetermined distance of the corresponding lift pins, then the lift pin receiving elements 322 move to receive the lift pins, thereby positioning the top edge ring 308. Put another way, if the top edge ring 308 is placed within a predetermined distance of a target position (a position where top ends of the lift pins are located in the lift pin receiving elements), then the top edge ring 308 moves to the target position. This is due to the inclusion of the 'V'-shaped grooves and may also be due to beveled opening edges of the lift pin receiving elements. Example beveled opening edges are shown in FIGS. 5 and 7. As an example, if the top edge ring 308 is positioned within ±5% of the target position, then the top edge ring 308 moves to the target position defined by the lift pin receiving elements 322. The top edge ring 308 drops into place and is held on the lift pins by gravity.

The kinematic coupling between the lift pin receiving elements of the top edge ring 308 and the lift pins allows the top edge ring 308 to be centered to a same location relative to the substrate support 304 independent of erosion over time of the edge rings 308, 310, 312. This consistent centering occurs due to the uniform erosion (i.e. erosion at a same rate) of the surfaces 342, 344 and uniform erosion of the top end 332. The kinematic coupling also allows certain tolerances to be relaxed (i.e. increased). For example, tolerances of the dimensions of the lift pin receiving elements may be increased, since the edge ring 308 is positioned in approximately a same location relative to the lift pins each time the edge ring 308 is placed. As another example, gaps between the edge rings 308, 310, 312 may be increased due to the consistent placement of the edge ring 308 on the lift pins. The uniform erosion maintains centering of the top edge ring 308 for the usable lifetime of the top edge ring 308.

Also, if the top edge ring 308 is not centered on the substrate support 304 and/or is not concentric with the substrate 306, then a center of the top edge ring 308 is (i) offset from a center of the substrate support 304 and/or a top plate of the substrate support 304, and/or (ii) offset from a center of the substrate 306. These offsets may be determined and will consistently exist. As a result, the controllers 142, 160 of FIG. 1 may account for and/or compensate for these offsets when processing the substrate 306. This may include adjust parameters, such as gas pressures, electrode voltages, bias voltages, etc. to compensate for these offsets.

In one embodiment, the edge rings 308, 310, 312 are formed of quartz and/or one or more other suitable non-volatile materials. The lift pin 324 may be formed of sapphire and/or one or more other suitable volatile materials. This minimizes erosion and particle generation during processing. Examples of volatile materials are alumina, silicon carbide and sapphire.

Figure 4:
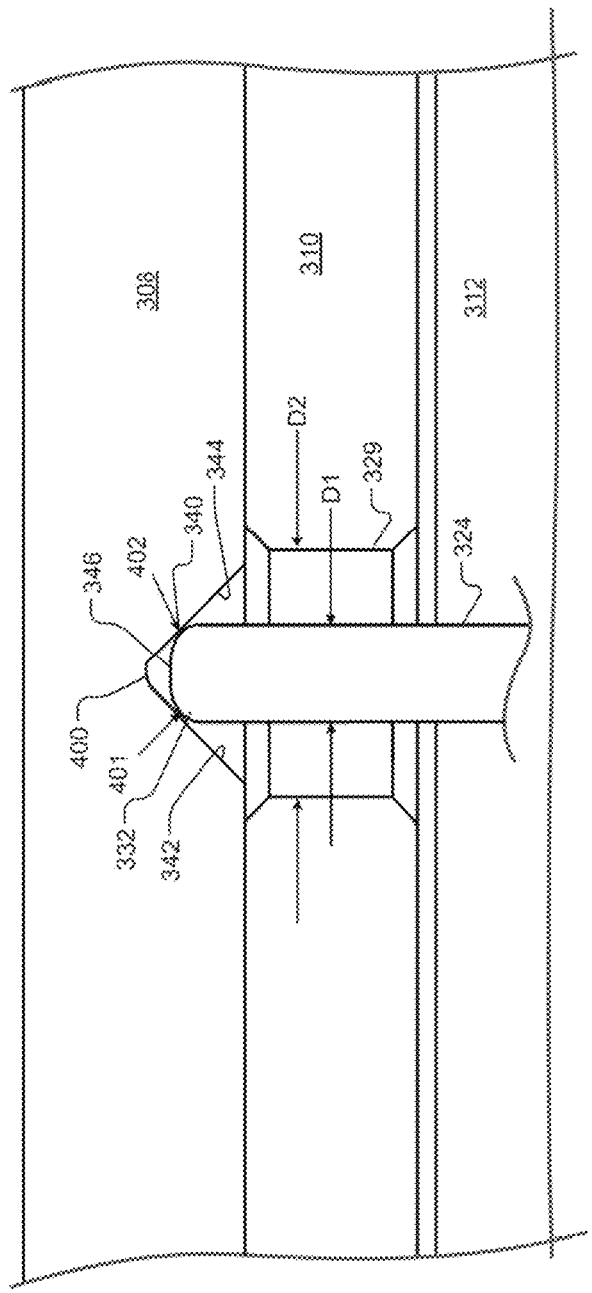
FIG. 4 is an example of an azimuthal cross-sectional view of a portion of a top edge ring and corresponding lift pin illustrating pin-to-groove interaction in accordance with an embodiment of the present disclosure.

FIG. 4 shows a portion of the top edge ring 308 and corresponding lift pin 324 illustrating pin-to-groove interaction. The top end 332 of the lift pin 324 contacts the surfaces 342, 344 at respectively two points 401, 402 via a rounded edge portion 340. This provides minimal contact for minimal reaction forces. The minimal contact minimizes erosion of the surfaces 342, 344 and the top end 332. This radial to flat contact between the rounded edge portion 340 and the surfaces 342, 344 follows Hertz's Law. As an example, a diameter D1 of the lift pin 324 may be 0.040" and may be up to 0.0250". In an embodiment, the diameter D1 is 0.060"-0.080". A diameter of the hole 329 in the middle edge ring 310 may be 2-3 times the diameter of the lift pin 324. The flat top portion 346 of the lift pin 324 does not contact the vertex portion 400.

FIG. 5 shows the lift pin receiving element 322, which includes a 'V'-shaped groove 500 with the surfaces 342, 344 and half conically shaped (or quarter spherically shaped) ends 502, 504. The surfaces 342, 344 and the ends 502, 504 meet at a vertex portion 506, which may be rounded, as shown. The surfaces 342, 344 and the ends 502, 504 have beveled opening edges 508, 510, 512, 514. The beveled opening edges 508, 510, 512, 514 aid in positioning lift pins into the V-shaped groove 500.

FIG. 6 shows the top edge ring 308 having multiple lift pin receiving elements 322, 322', 322" including respective 'V'-shaped grooves having half conically-shaped ends as shown or quarter hemi-spherically shaped ends. Each of the 'V'-shaped grooves allows the corresponding lift pin to move radially relative to the 'V'-shaped groove, but prevents annular movement of the corresponding lift pin. Three lift pins 600 are shown, one of which may be the lift pin 324 of FIG. 3A.

FIG. 7 shows a portion of the top edge ring 308 illustrating dimensions of a 'V'-shaped groove 700. The V-shaped groove 700 includes the side surfaces 342, 344, a vertex portion 702, and beveled edges 704, 706. The vertex portion 702 may have a first predetermined radius R1 and the beveled edges 704, 706 may have respective predetermined radii R2, R3. As an example, the radii R1, R2, R3 may be 0.015". Radius R1 may be between 0.002" and 0.125". Radius R2 may be between 0.002" and 0.125". Radius R3 may be between 0.002" and 0.125". Each of the surfaces 342, 344 may be at a predetermined angle A1 relative to a center line 710 of the V-shaped groove 700. The surfaces 342, 344 may be at a predetermined angle A2 relative to each other. As an example, the predetermined angle A1 may be 45°. The predetermined angle A1 may be between 5° and 90°. As an example, the predetermined angle A2 may be 90°. The predetermined angle A2 may be between 10° and 180°.

The 'V'-shaped groove 700 has a predetermined opening width W1. The beveled edges 704, 706 have a predetermined opening width W2, which is greater than W1. As an example the predetermined opening width W1 may be 0.104". The predetermined opening width W1 may be between 0.020" and 0.500". The predetermined opening width W2 may be between 0.024" and 0.750". The 'V'-shaped groove 700 has a predetermined depth DP1. The depth DP1 may be between 0.010" and 0.250".

A ratio between the depth DP1 and a diameter D1 (shown in FIG. 4) of a corresponding lift pin 324 may be approximately equal to 1 (or 1:1). The ratio between the depth DP1 and the diameter D1 may be between 10:1 and 1:8. In an embodiment, the depth DP1 is 0.062". The depth DP1 may be between 0.005" and 0.250". A ratio between the width W1 and the diameter D1 may be 2:1. The ratio between the width W2 and the diameter D1 may be between 20:1 and 1:4. A ratio between a depth DP2 of the lift pin 324 in the 'V'-shaped groove 700 and the depth DP1 may be approximately equal to 5.0:6.2 or 80%, where the depth DP2 is 0.050" and the depth DP1 is 0.062". The ratio between the depth DP2 and the depth DP1 may be between 10:1 and 99:100. The depth DP2 may be between 0.001" and 0.500". In an embodiment, the depth DP2 is 0.050".

In an embodiment, the angle A2 is 90°, the depth DP2 is 0.050", the diameter D1 is the depth DP1 is 0.062", and the width W1 is 0.104". This: provides two points of contact between the lift pin 324 and the 'V'-shaped groove 700; provides an appropriate amount of space between a top of the lift pin 324 and the vertex portion 702 (or top) of the 'V'-shaped groove 700 to prevent bottoming out; maximizes a thickness T1 between the 'V'-shaped groove 700 and a top surface of the top edge ring 308; and provides an opening width sized to provide an appropriate amount of placement tolerance for positioning and centering the corresponding top edge ring 308 relative to a substrate support and guiding the lift pin 324 into the 'V'-shaped groove 700. The edge ring 308 may have an overall thickness T2 and a top surface to 'V'-shaped groove thickness T1. The thickness T2 may be between 0.025" and 10". The thickness T1 may be between 0.02" and 9.995". In an embodiment, the thickness T2 is 0.145" and the thickness T1 is 0.083".

The larger the angle A2, the more likely that the lift pin 324 will bottom out and contact the vertex portion 702. The smaller the angle A2, the deeper is the groove 700 and the smaller is the thickness T1, which reduces lifetime of the top edge ring 308. The wider the width W1 of the opening, while maintaining the angle A2 at a constant value, the smaller the thickness T1 and the less restrictive the horizontal placement of the lift pin 324. The narrower the width W1, while maintaining the angle A2 at constant value, the larger the thickness T1 and the more restrictive the horizontal placement of the lift pin 324.

Figure 8:
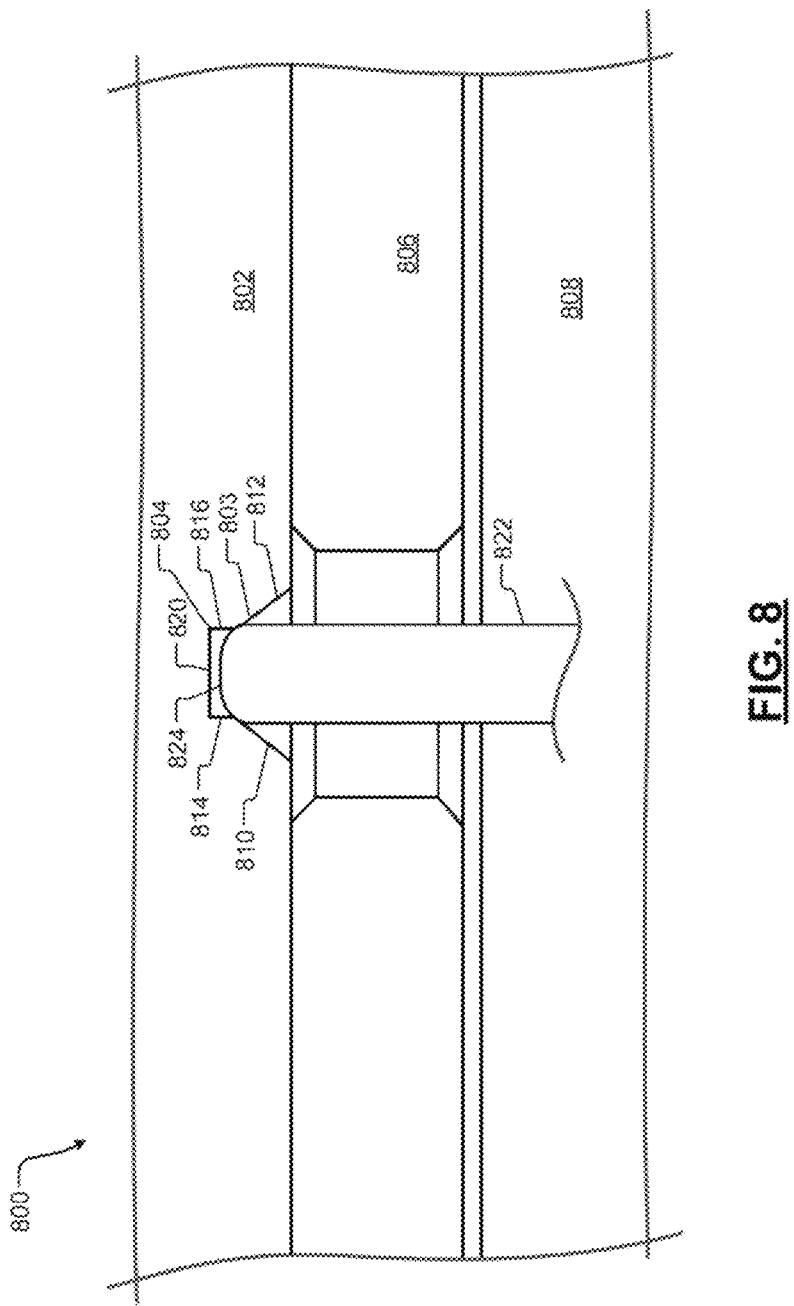
FIG. 8 is a cross-sectional side view of a portion of an edge ring stack illustrating an example of a top edge ring having a lift pin receiving element in the form of a groove with a flat recessed top portion in accordance with an embodiment of the present disclosure.
Figure 9:
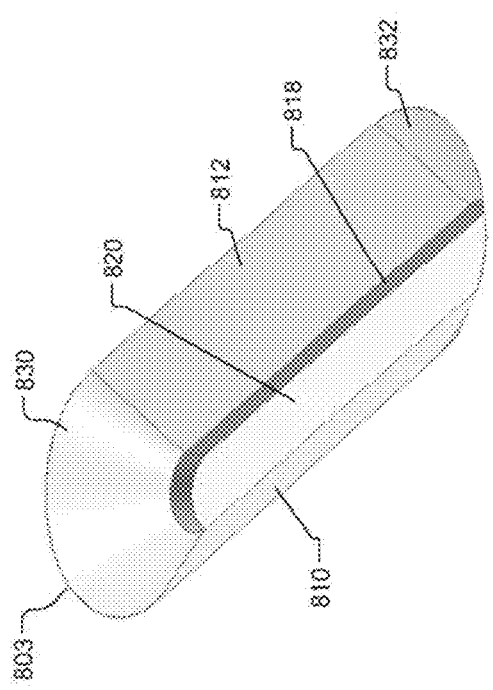
FIG. 9 is a perspective view of the lift pin receiving element of FIG. 8.

FIG. 8 shows a portion 800 of an edge ring stack illustrating an example of a top edge ring 802 having a lift pin receiving element 803 in the form of a groove with a flat recessed top portion 804. This style lift pin receiving element may replace or be used in combination with the lift pin receiving element shown in FIGS. 3A-7, as further described below. The top edge ring 802 may be disposed on a middle edge ring 806, which may be disposed on a bottom edge ring 808. The lift pin receiving element 803 includes V-shaped side walls 810, 812 that extend inward towards the flat recessed portion 804. The flat recessed portion 804 is cup-shaped and includes side walls 814, 816 that are part of a continuous slot-shaped side wall 818 (shown in FIG. 9) of the flat recessed portion 804. FIG. 9 shows the lift pin receiving element 803. The flat recessed portion 804 further includes a flat top surface 820.

A lift pin 822 may be disposed in the lift pin receiving element 803 and contacts top portions of the side walls 810, 812. The lift pin 822 does not contact the flat recessed portion 804. A top portion 824 of the lift pin 822 may protrude into an open area defined by the flat recessed portion 804. The top portion 824 may have a top flat surface, as shown. The lift pin receiving element 803, as shown in FIG. 9, further includes half conically shaped ends 830, 832, which are adjacent the side walls 810, 812.

Figure 10:
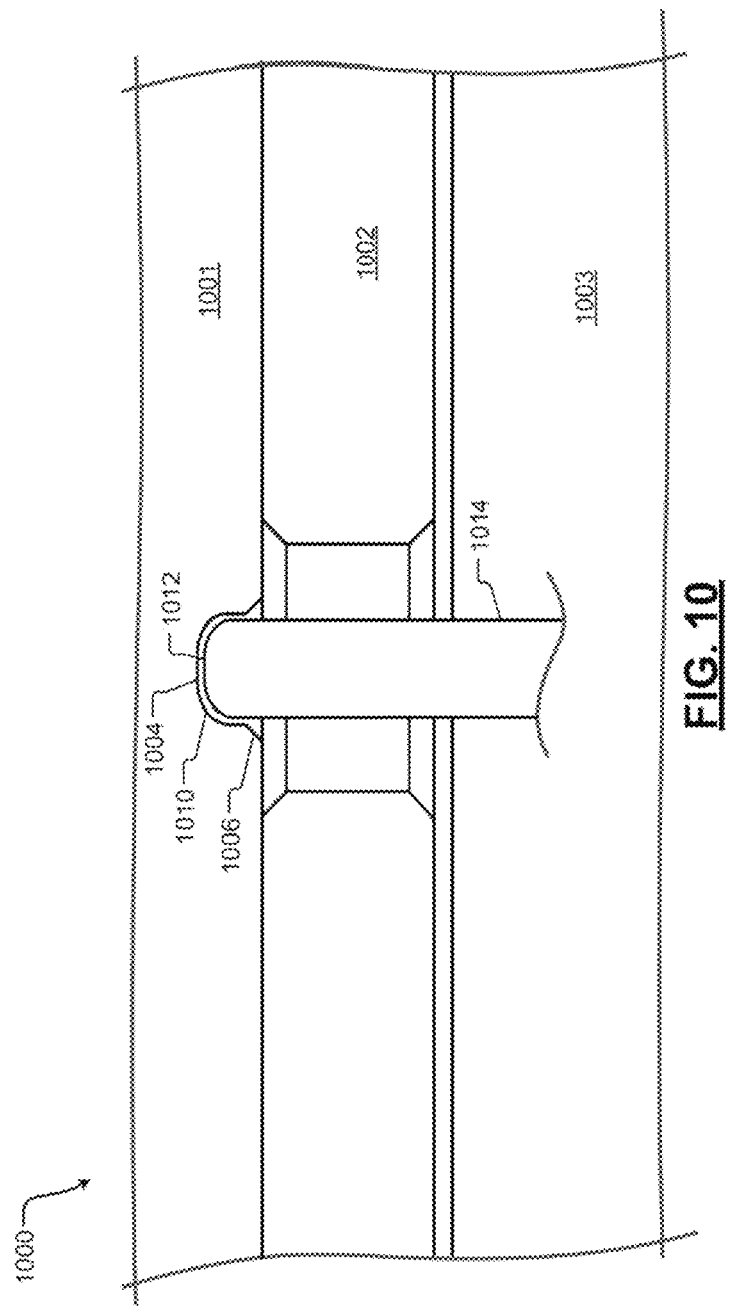
FIG. 10 is a cross-sectional side view of a portion of an edge ring stack illustrating an example of a top edge ring having lift pin receiving element in the form of a divot in accordance with an embodiment of the present disclosure.
Figure 11:
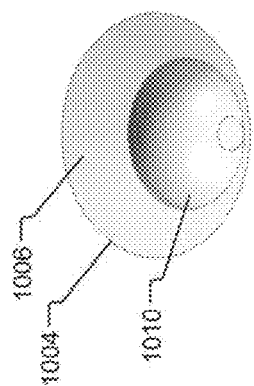
FIG. 11 is a perspective view of the lift pin receiving element of FIG. 10.

FIG. 10 shows a portion 1000 of an edge ring stack illustrating an example of a top edge ring 1001 having a lift pin receiving element 1004 in the form of a divot. The edge ring stack includes edge rings 1001, 1002, 1003. The divot 1004 may include a chamfered side wall 1006 and a hemi-spherically shaped portion 1010. A top portion 1012 of a lift pin 1014 may be hemi-spherically shaped and be disposed in the hemi-spherically shaped portion 1010. The portions 1010, 1012 may have top flat surfaces, as shown. FIG. 11 shows the divot 1004 and illustrates the chamfered side wall 1006 and the hemi-spherically shaped portion 1010.

Figure 12:
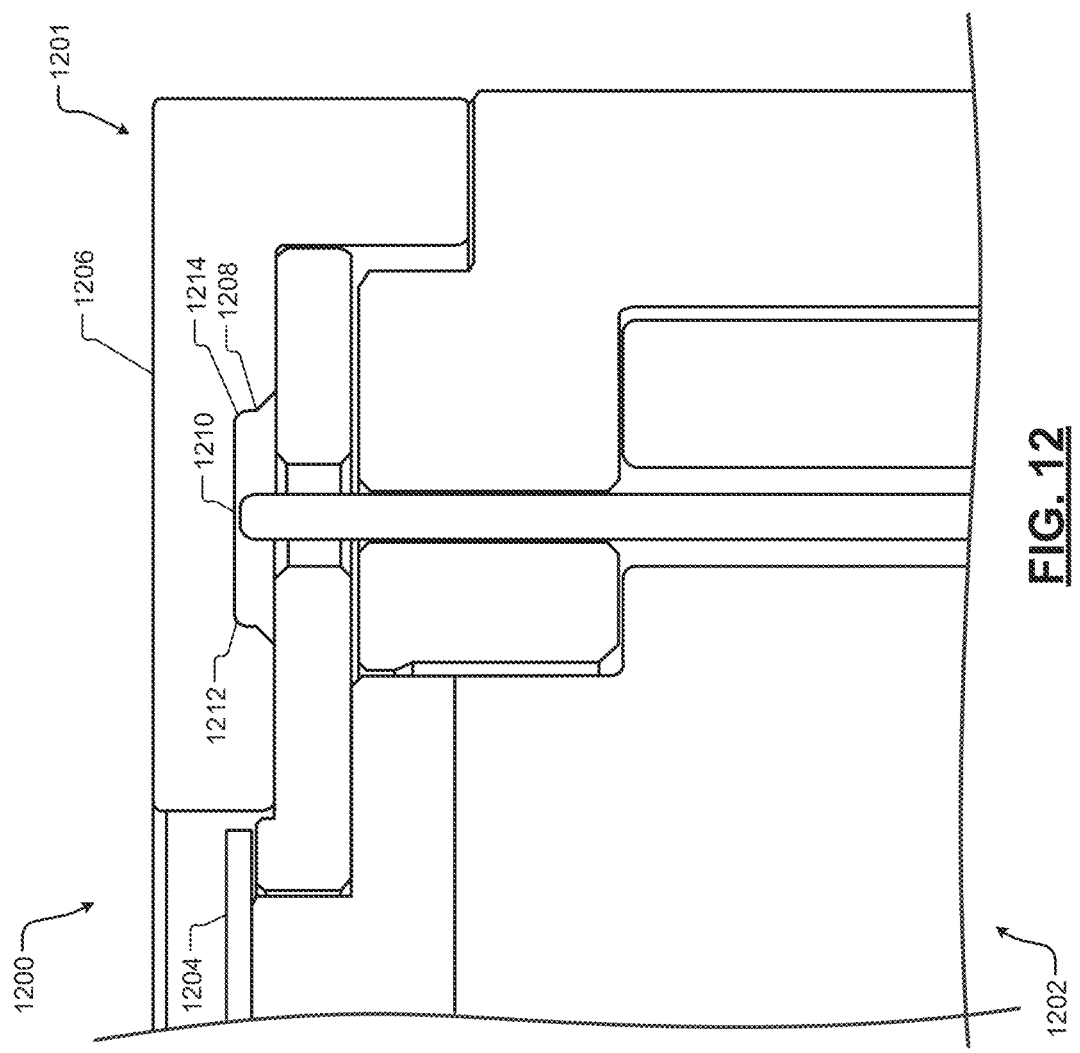
FIG. 12 is a cross-sectional side view of an example of an edge ring assembly, substrate support and substrate illustrating an example of a top edge ring with a lift pin receiving element including a groove having a recessed top portion with quarter spherically shaped ends in accordance with an embodiment of the present disclosure.
Figure 13:
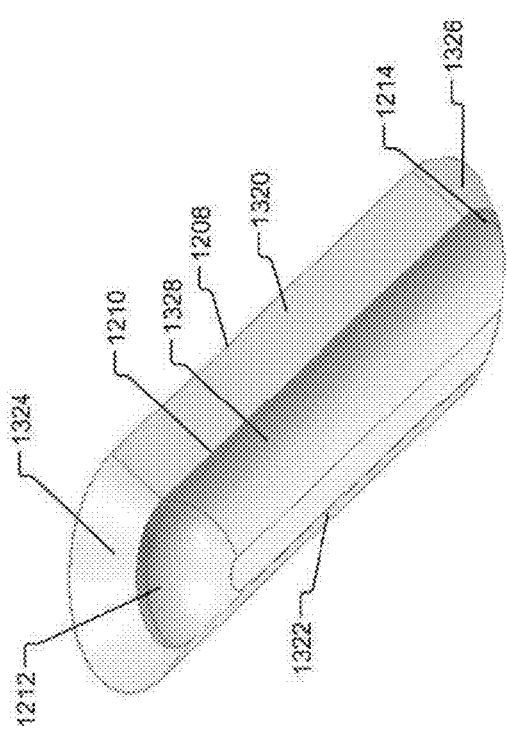
FIG. 13 is a perspective view of the lift pin receiving element of the top edge ring of FIG. 12.

FIG. 12 shows a portion 1200 of an edge ring assembly 1201, substrate support 1202 and substrate 1204 illustrating an example of a top edge ring 1206 with a lift pin receiving element 1208 in the form of a groove having a recessed top portion 1210 with quarter spherically shaped ends 1212, 1214. The portion 1200 may be similar to the portion 300 of FIG. 3A, but includes the top edge ring 1206 having the lift pin receiving element 1208 instead of the groove 322. FIG. 13 shows the lift pin receiving element 1208. The lift pin receiving element 1208 includes 'V'-shaped side walls 1320, 1322, conically shaped end walls 1324, 1326, a '1J'-shaped top wall 1328 and the quarter spherically shaped ends 1212, 1214.

Figure 14:
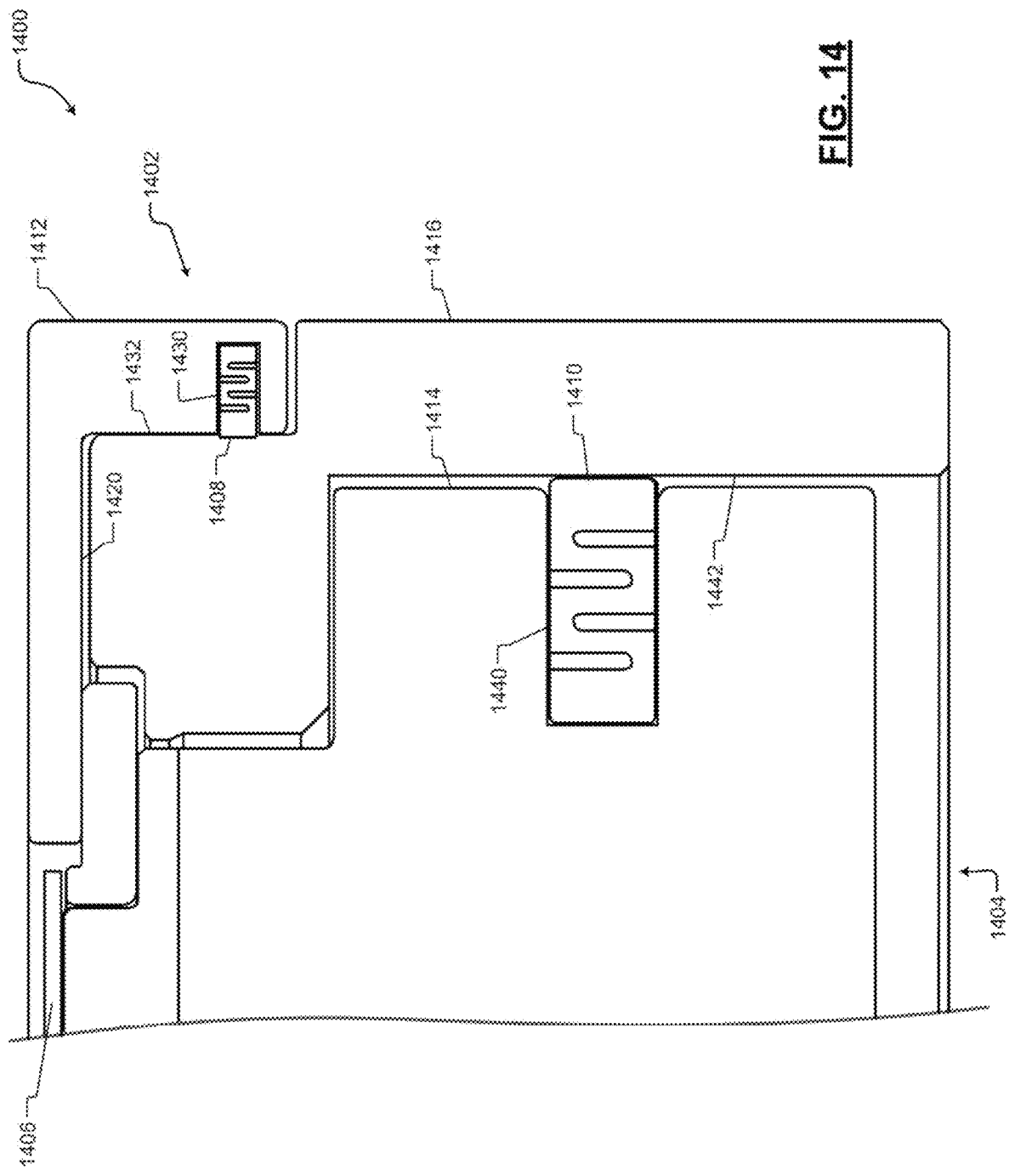
FIG. 14 is a cross-sectional side view of an example portion of an edge ring assembly, a substrate support and substrate illustrating incorporation of stability elements disposed within the substrate support and/or one or more edge rings in accordance with an embodiment of the present disclosure.

FIG. 14 shows a portion 1400 of an edge ring assembly 1402, a substrate support 1404 and substrate 1406 illustrating incorporation of stability elements 1408, 1410. The stability elements 1408, 1410 are disposed respectively within a top edge ring 1412 and a substrate support 1414.

Although two stability elements are shown, any number of stability elements may be included. The top edge ring 1412 may include three or more stability elements. Similarly, the substrate support 1414 may include three or more stability elements. In one embodiment, the stability elements of the top edge ring 1412 are disposed 120° apart from each other. In one embodiment, the stability elements of the substrate support 1414 are disposed 120° apart from each other. The stability elements may include and/or be implemented as springs.

The stability element 1408 is disposed in an inner pocket 1430 of the top edge ring 1412 and applies pressure on an outer peripheral surface 1432 of the edge ring 1416. The stability elements 1410 is disposed in an outer pocket 1440 of the substrate support 1414 and applies pressure on an inner surface 1442 of the edge ring 1416. Although stability elements are shown as being disposed in the top edge ring 1412 and the substrate support 1410, the stability elements may be located in other edge rings, such as in the edge ring 1416.

In one embodiment, the stability elements are included without use of lift pin receiving elements in the top edge ring 1412. Tops of lift pins may abut a bottom inner surface 1420 of the top edge ring 1412. In another embodiment, the stability elements are incorporated in combination with lift pin receiving elements, such as the lift pin receiving elements shown in FIGS. 1-13, 15-21 and 25.

Figure 15:
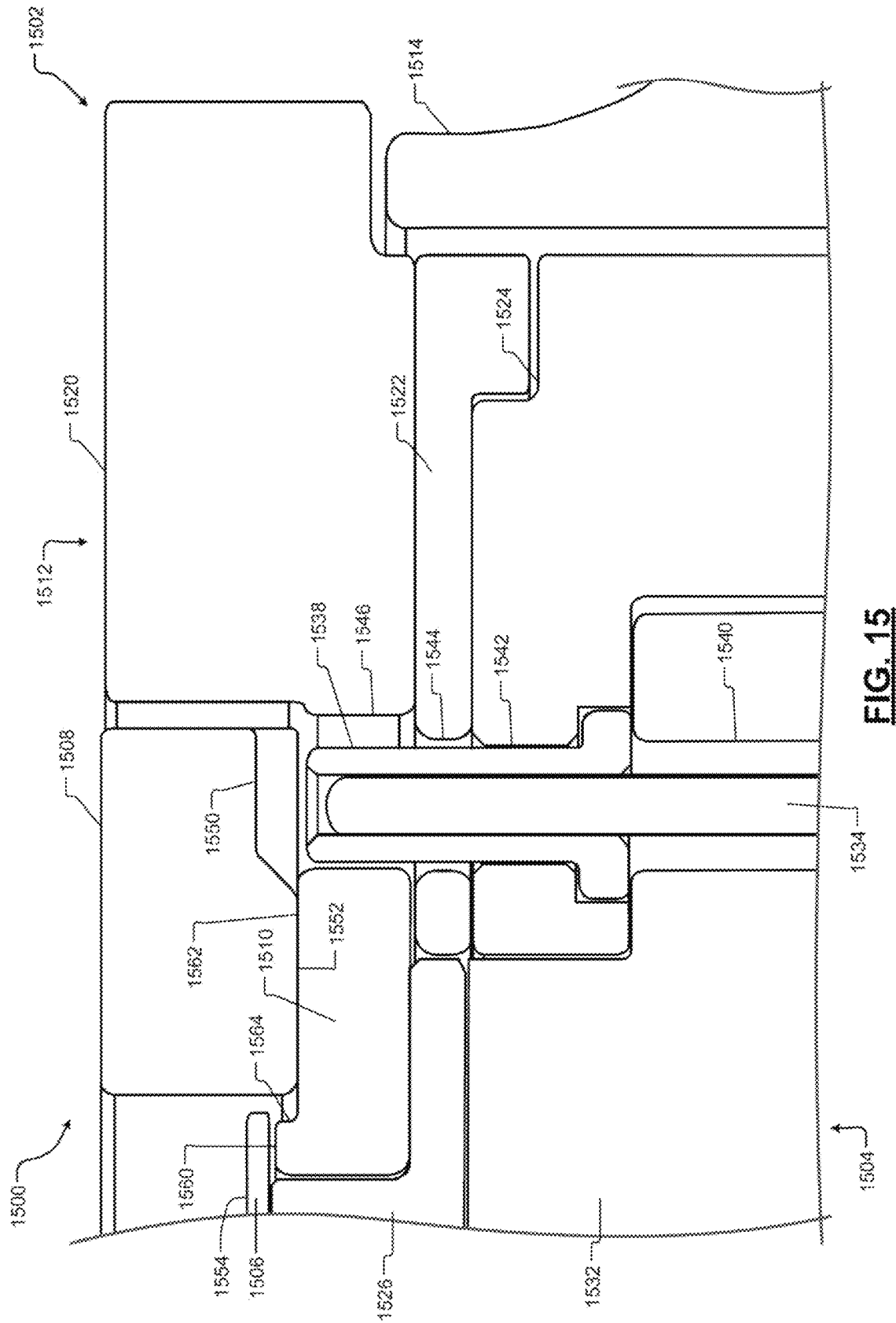
FIG. 15 is a cross-sectional side view of an example of an edge ring assembly, a substrate support and a substrate illustrating a top edge ring with peripherally located lift pin receiving elements in accordance with an embodiment of the present disclosure.

FIG. 15 shows a portion 1500 of an edge ring assembly 1502, a substrate support 1504 and a substrate 1506. The edge ring assembly 1502 includes a top edge ring 1508, an inner stabilizing edge ring 1510, an edge ring stack 1512, and a liner 1514. The edge ring stack 1512 includes an outer peripheral edge ring 1520, a middle edge ring 1522, and a bottom edge ring 1524. The substrate support 1504 includes a top plate 1526 and a baseplate 1532. A lift pin 1534 is received in a shield 1538. The lift pin 1534 extends through a channel 1540 of the base plate 1532. The shield 1538 is disposed on the base plate 1532 and extends through holes 1542, 1544 and 1546 respectively in the edge rings 1524, 1522, 1520. The shield 1538 protects an upper portion of the lift pin 1534 from erosion. The liner 1514 is annular-shaped and disposed outside of and protects from erosion an outer periphery of the edge rings 1522, 1524 and a bottom of an outer periphery of the outer peripheral edge ring 1520.

Figure 16:
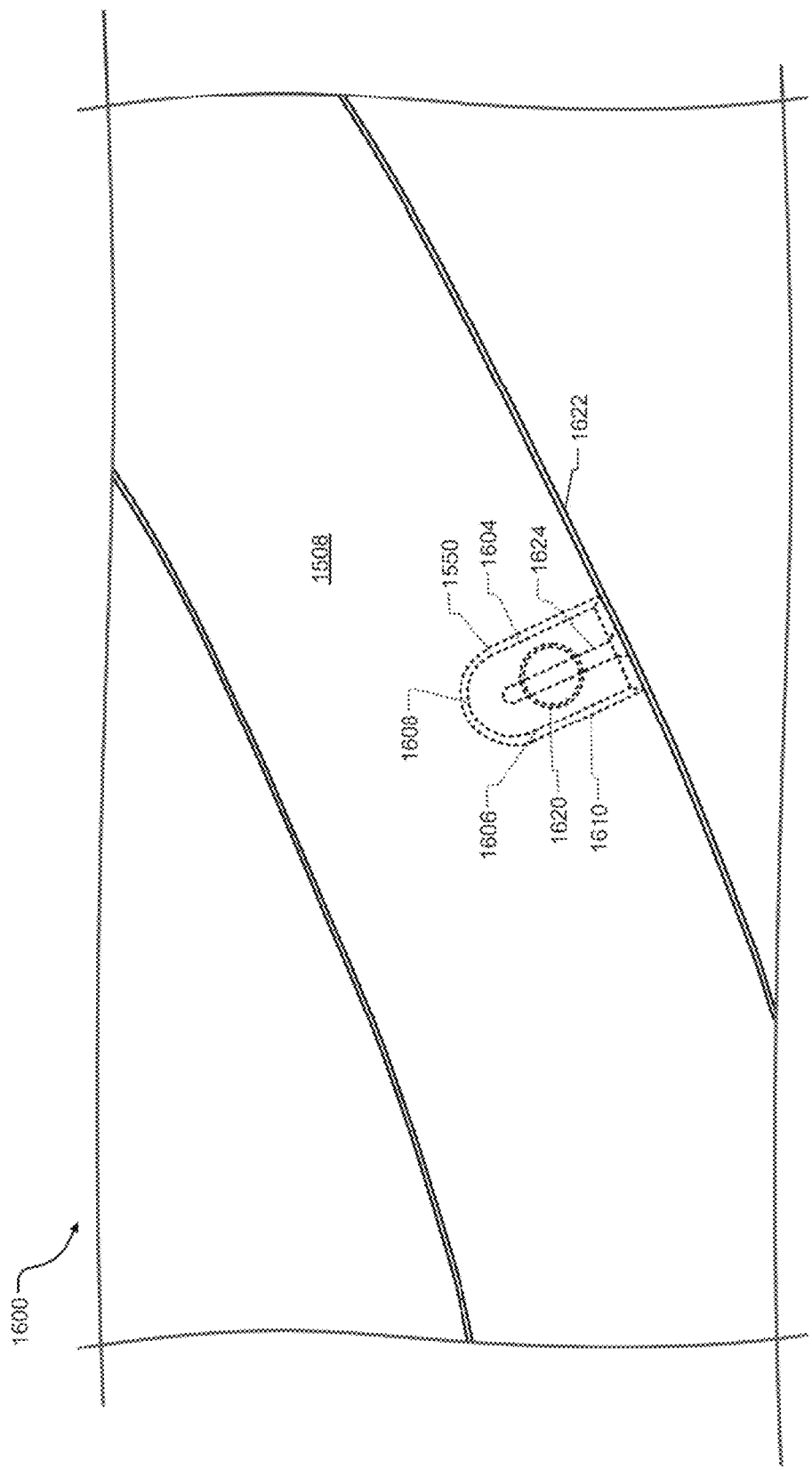
FIG. 16 is top view of an example of a portion of the top edge ring of FIG. 15.
Figure 17:
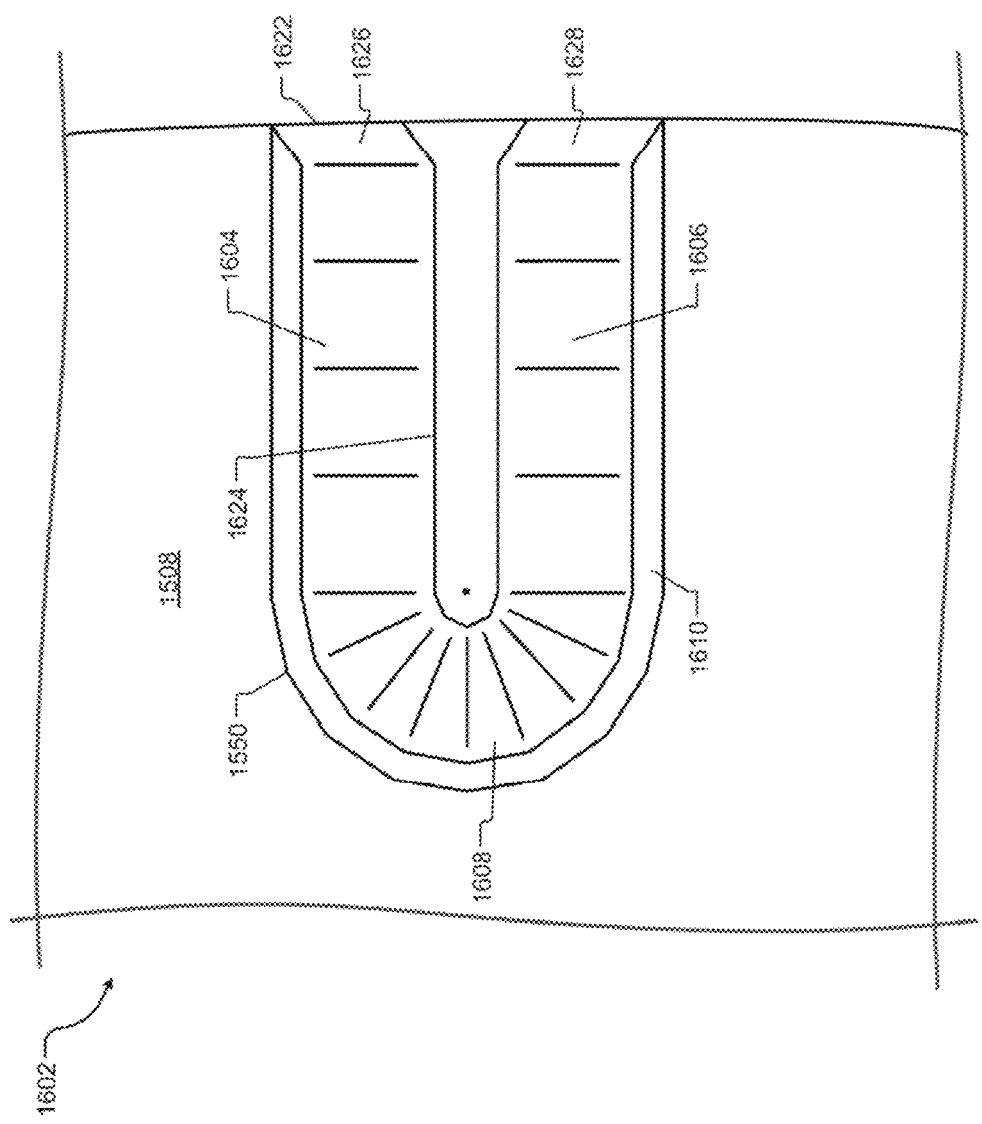
FIG. 17 is a bottom view of one of the peripherally located lift pin receiving elements of FIG. 15.
Figure 18:
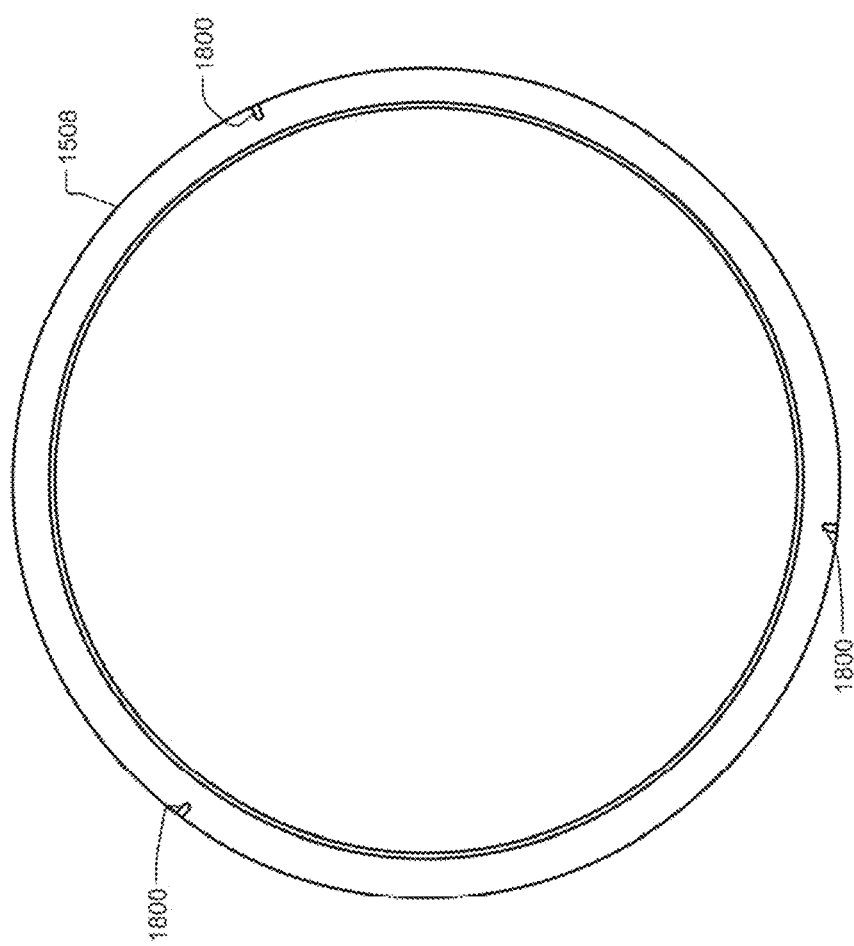
FIG. 18 is a bottom view of the top edge ring of FIG. 15.
Figure 20:
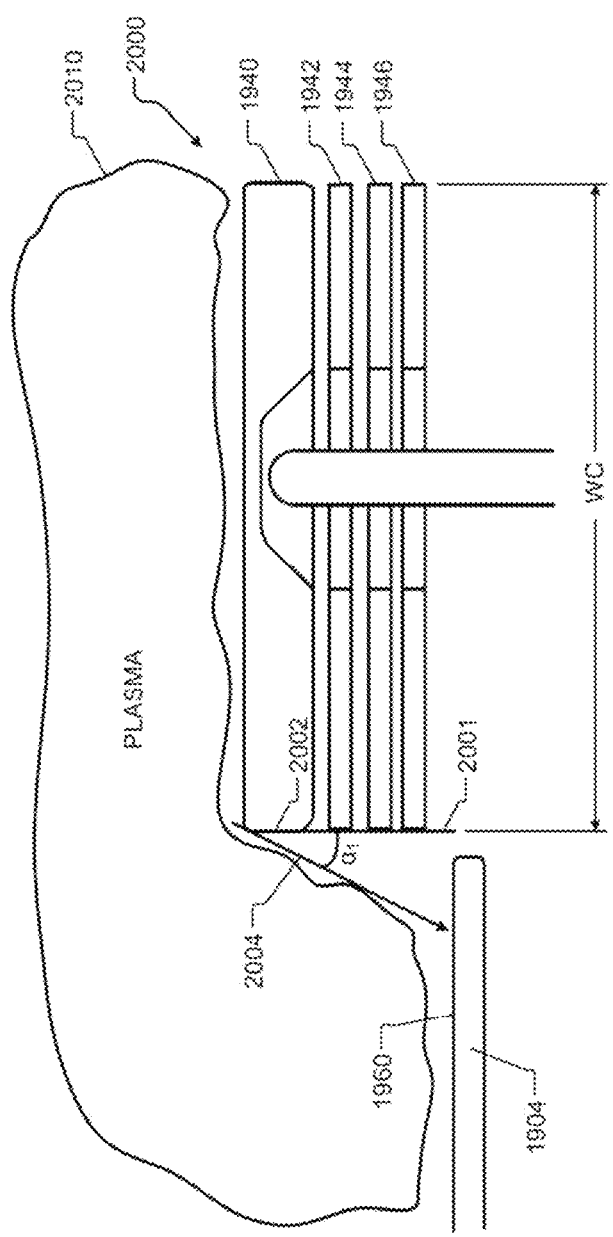
FIG. 20 is a cross-sectional side view of an example of a portion of another collapsible edge ring assembly in a first partially expanded state and illustrating a corresponding plasma sheath tilt angle in accordance with an embodiment of the present disclosure.
Figure 21:
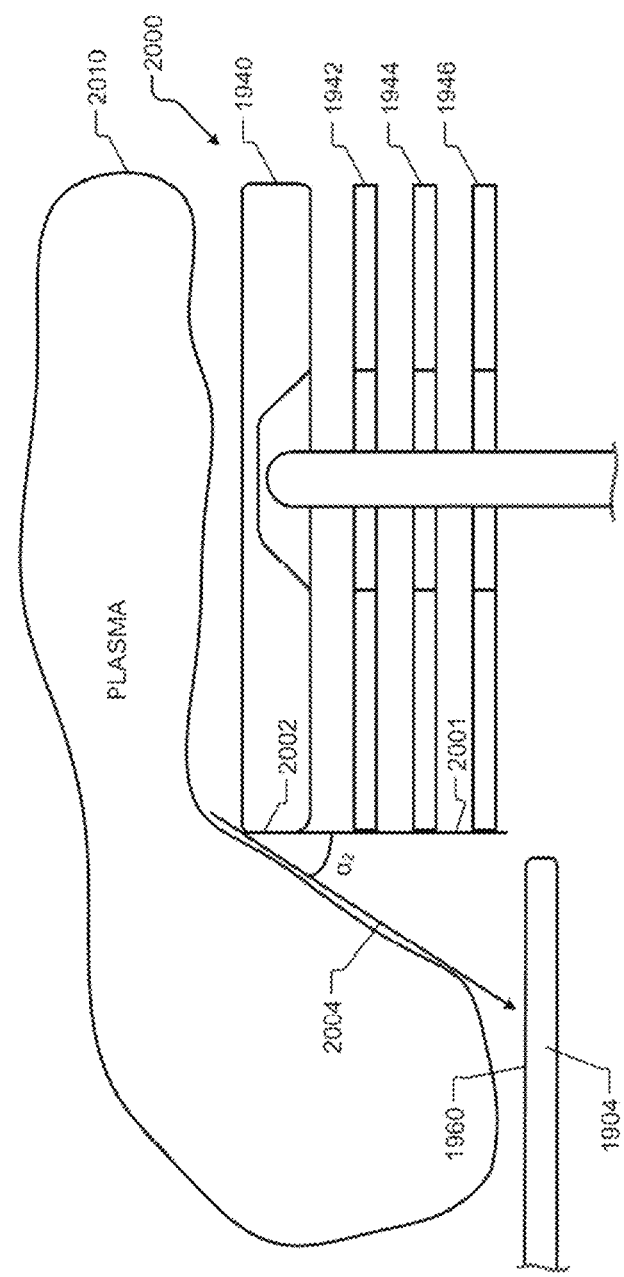
FIG. 21 is a cross-sectional side view of the portion of the collapsible edge ring assembly of FIG. 20 in a second partially expanded state and illustrating a corresponding plasma sheath tilt angle.

The top edge ring 1508 includes peripherally located lift pin receiving elements (one lift pin receiving element 1550 is shown). In the example shown, the lift pin receiving elements are in the form of notches located at an outer bottom periphery of the top edge ring 1508. Lift pin receiving elements of a different style may be incorporated. Examples of the notches are shown in FIGS. 16-18. The lift pin 1534 is moved upward in the base plate 1532 and the shield 1538 and into the lift pin receiving element 1550 to raise the top edge ring 1508. The top edge ring 1508 may be raised, such that a bottom surface 1552 of the top edge ring 1508 is above a top surface 1554 of the substrate 1506. As an example, the top edge ring 1508 may be raised 0.24"-0.60". In an embodiment, the top edge ring 1508 is raised 0.15"-0.2" during processing of the substrate 1506. Raising the top edge ring 1508 moves and shapes a plasma sheath located above the substrate 1506 and the top edge ring 1508, which affects how ions are directed at the substrate 1506. The higher the top edge ring 1508 is raised relative to the substrate 1506, the more a tilt angle of the plasma sheath is changed. Example tilt angles are shown in FIGS. 20-21. The top edge ring 1508 may be raised up to a first level during processing. The top edge ring 1508 may be raised up to a second level to be removed via an arm, as described above. The second level may be higher than the first level.

The stabilizing edge ring 1510 includes a first top surface 1560 and a second top surface 1562 and an instep 1564. The first top surface 1560 is disposed under the substrate 1506. The second top surface 1562 is disposed under the top edge ring 1508. The first top surface 1560 transitions to the second top surface 1562 via the instep 1564. As an example, a height of the instep 1564 from the second top surface 1562 to the first top surface 1560 may be 0.30". The instep 1564 (i) aids in declamping the substrate 1506 from the substrate support 1504, (ii) aids in maintaining positioning of the top edge ring 1508 including preventing the top edge ring from tilting relative to the substrate 1506, and (iii) aids in preventing the substrate 1506 from moving under the top edge ring 1508 when, for example, the substrate 1506 is not clamped to the substrate support 1504.

As an example, the edge rings 1508 and 1520 may be formed of a non-volatile material, such as quartz. The edge ring 1510 may be formed of a volatile material, such as silicon carbide and/or sapphire. The edge rings 1522 and 1524 may be formed of a volatile material, such as alumina. The liner 1514 may be formed of a metallic material.

FIGS. 16-17 show portions 1600, 1602 of the top edge ring 1508 illustrating the lift pin receiving element 1550. The lift pin receiving element 1550 is shown in the form of a notch and includes V-shaped side walls 1604, 1606, and a half conically shaped (or quarter spherically shaped) end 1608. The lift pin receiving element 1550 may include a beveled edge 1610 along a bottom outer portion of the lift pin receiving element 1550. A lift pin 1620 is shown as being received in the lift pin receiving element 1550. The lift pin receiving element 1550 extends from a peripheral edge 1622 of the top edge ring 1508. The lift pin receiving element 1550 may include a vertex portion 1624 that may be flat, cup-shaped, and/or rounded. The 'V'-shaped side walls 1604, 1606 may be beveled upward near the peripheral edge to provide beveled sections 1626, 1628.

FIG. 18 shows the top edge ring 1508, which may include three or more of the lift pin receiving elements. In FIG. 18, three lift pin receiving elements 1800 are shown, one of which may be the lift pin receiving element 1550. The three lift pin receiving elements 1800 may be 120° spaced apart along a peripheral edge of the top edge ring 1508.

Figure 19:
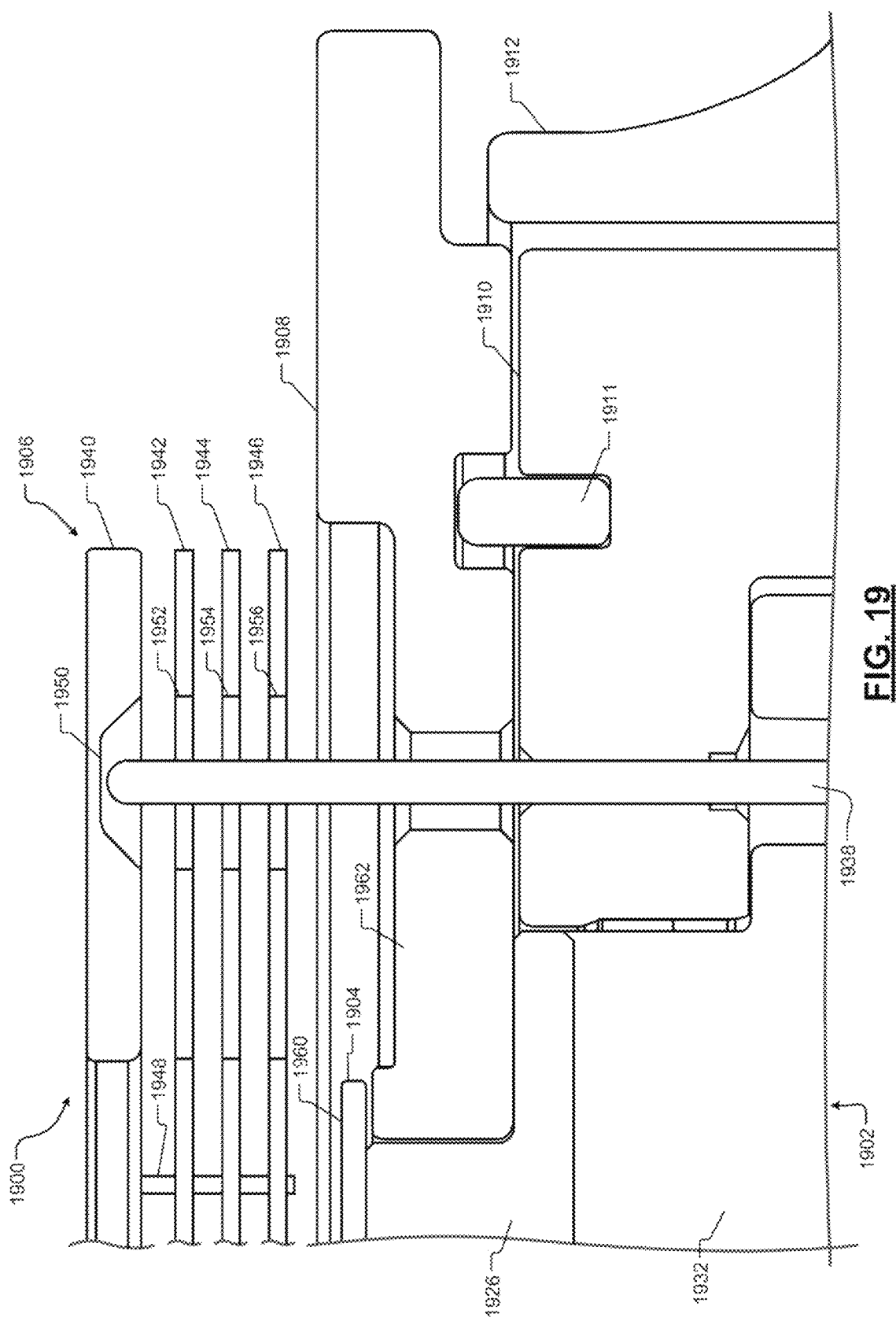
FIG. 19 is a cross-sectional side view of an edge ring system, a substrate support and a substrate illustrating an example of a collapsible edge ring assembly in accordance with an embodiment of the present disclosure.

FIG. 19 shows an edge ring system 1900, a substrate support 1902 and a substrate 1904. The edge ring system 1900 includes a collapsible edge ring assembly 1906, an upper outer edge ring 1908, a lower outer edge ring 1910, an alignment pin 1911, and a liner 1912. The alignment pin 1911 maintains alignment between the edge rings 1908, 1910. The liner 1912 protects the outer periphery of the lower outer edge ring 1910 and a bottom portion of the upper outer edge ring 1908 from erosion. The substrate support 1902 includes a top plate 1926, seals 1928, 1930, and a baseplate 1932. A lift pin 1938 extends through the edge rings 1908, 1910 and into the collapsible edge ring assembly 1906.

The collapsible edge ring assembly 1906 includes a top edge ring 1940, one or more intermediate edge rings (intermediate edge rings 1942, 1944, 1946 are shown), and three or more ring alignment and spacing elements (one ring alignment and spacing element 1948 is shown). The edge rings 1940, 1942, 1944, 1946 provide tuning using multiple edge rings. This increases a tuning range over a single edge ring design because the top edge ring 1940 is able to be lifted to an increased height without plasma flowing under the top edge ring 1940. The multiple edge rings may be sized and lifted via lift pins to be replaced while a corresponding processing chamber is under vacuum. The ring alignment and spacing elements are incorporated to maintain lateral (or radial) alignment of the edge rings 1940, 1942, 1944, 1946 relative to each other and to control vertical spacing between the edge rings 1940, 1942, 1944, 1946. Alignment of the edge rings 1940, 1942, 1944, 1946 is aided by "V"-shaped grooves of lift pin receiving elements (one lift pin receiving element 1950 is shown) in the top edge ring 1940. The top edge ring 1940 includes one or more lift pin receiving elements. The lift pin receiving elements may be implemented as any of the lift pin receiving elements disclosed in, for example, FIGS. 3A-13. The edge rings 1942, 1944, 1946 include holes 1952, 1954, 1956 through which the lift pin 1938 is passed.

The ring alignment and spacing elements may extend at least partially into and/or through, connect to, adhere to, be pressed against corresponding portions of the edge rings 1940, 1942, 1944, 1946. The ring alignment and spacing elements may be collapsible. The ring alignment and spacing elements may have concertinaed walls (or be "accordion-like") and/or have telescopic features that allow the ring alignment and spacing elements to be compressed and expanded. The ring alignment and spacing elements may include interlocking elements similar to a telescopic device, such that each section of the ring alignment and spacing elements interlocks with one or more adjacent sections. Examples of ring alignment and spacing elements are shown in FIGS. 22A-26. The ring alignment and spacing elements allow corresponding lift pins (e.g., the lift pin 1938) to directly lift the top edge ring 1940 followed by indirectly and successively lifting the intermediate edge rings 1942, 1944, 1946 as a result of the edge rings 1940, 1942, 1944, 1946 being connected via the ring alignment and spacing elements. The edge rings 1940, 1942, 1944, 1946 are lifted to different heights. In one embodiment, each of the ring alignment and spacing elements has a respective amount of wrappings to provide a respective amount of separation between corresponding edge rings. The ring alignment and spacing elements may provide a predetermined spacing pattern of the edge rings 1940, 1942, 1944, 1946. Different spacing patterns may be provided for different applications, recipes, etching patterns, etc.

The ring alignment and spacing elements have a fully retracted state, a fully expanded state, and multiple intermediate (or partially expanded) states therebetween. While in the fully retracted state, the ring alignment and spacing elements may be in contact with each other or have a minimum amount of separation between adjacent ones of the ring alignment and spacing elements. While in the fully expanded state, the edge rings 1940, 1942, 1944, 1946 are separated from each other and have a maximum amount of separation between adjacent ones of the edge rings 1940, 1942, 1944, 1946. While being extracted, the top edge ring 1940 is lifted first without movement of the intermediate edge rings 1942, 1944, 1946. When a distance between the top edge ring 1940 and a first one of the intermediate edge ring 1942 is at a maximum, then the first intermediate edge ring 1942 is lifted. A similar process occurs for each successive intermediate edge ring. Although a particular number of edge rings are shown as being part of the collapsible edge ring assembly 1906, two or more edge rings may be included.

As an example, the edge ring 1908 may be formed of a non-volatile material, such as quartz. The edge ring 1910 may be formed of a volatile material, such as alumina. The liner 1912 may be formed of a metallic material. The edge rings 1940, 1942, 1944, 1946 may be formed of a non-volatile material such as quartz. The ring alignment and spacing element 1948 may be formed of volatile material such as sapphire.

The ring alignment and spacing element 1948 may limit maximum separation distances between the edge rings 1940, 1942, 1944, 1946 to prevent plasma from flowing between the edge rings 1940, 1942, 1944, 1946. Flow of plasma between the edge rings 1940, 1942, 1944, 1946 can reduce and/or eliminate the plasma sheath tunability aspects associated with the vertical movement of the top edge ring 1940. Also, the lift pin 1938 may be limited from lifting the bottom most intermediate edge ring 1946 more than a predetermined distance above a top surface 1960 of the substrate 1904. As an example, the system controller 160 of FIG. 1 may limit the amount of movement of the lift pin 1938 to limit vertical lift of the bottom most intermediate edge ring 1946 to prevent plasma from flowing between the edge ring 1946 and the stabilizing edge ring 1962. Flow of plasma between the edge rings 1946 and 1962 can also reduce and/or eliminate the plasma sheath tunability aspects associated with the vertical movement of the top edge ring 1940. By limiting the maximum separation distances between adjacent pairs of the edge rings 1940, 1942, 1944, 1946, 1962, flow of plasma between the adjacent pairs is prevented.

FIGS. 20-21 show a portion 2000 of the collapsible edge ring assembly 1906 of FIG. 19, which includes the edge rings 1940, 1942, 1944, 1946. The collapsible edge ring assembly 1906 is shown in (i) a first partially expanded state and having a first corresponding plasma sheath tilt angle $\alpha_1$, and (ii) a second partially expanded state and having a second corresponding plasma sheath tilt angle $\alpha_2$. The collapsible edge ring assembly 1906 is shown in a more expanded state in FIG. 21 than in FIG. 20. For this reason, the plasma sheath tilt angle $\alpha$ is larger for the example of FIG. 21 than for the example of FIG. 20. The plasma sheath angle $\alpha$ may refer to an angle between (i) a vertical line 2001 extending through an inner peripheral edge 2002 of the top edge ring 1940 and (ii) a line 2004 representing an approximate periphery of plasma vertically along a periphery of the edge rings 1940, 1942, 1944 and 1946.

If a width WC of a cross-section of each of the edge rings 1940, 1942, 1944, 1946 is the same, then gaps between the edge rings 1940, 1942, 1944, 1946 and plasma 2010 may increase from a top surface of the top edge ring 1940 down to a bottom surface of the bottom most intermediate edge ring 1946. In one embodiment, the widths of the cross-sections of the edge rings 1940, 1942, 1944, 1946 may increase from the top edge ring 1940 down to the bottom most intermediate edge ring 1946, such that: the cross-section of the edge ring 1946 is wider than the cross-section of the edge ring 1944; the cross-section of the edge ring 1944 is wider than the cross-section of the edge ring 1942; and the cross-section of the edge ring 1942 is wider than the cross-section of the edge ring 1940. Also, due to the increased size of the gaps for lower edge rings, the tolerances in freedom of radial movement of lower edge rings is higher than the tolerances in freedom of radial movement of higher edge rings.

By controlling the lift positions of the edge rings 1940, 1942, 1944, 1946, the shape and tilt angle $\alpha$ of the plasma sheath is adjusted. The more the edge rings 1940, 1942, 1944, 1946 are lifted, the more the shape and tilt angle $\alpha$ are adjusted. This provides controllable etch tuning near a periphery (or circumferential edge) of the substrate 1904 to within 0.039". As the top edge ring 1940 is lifted, the tilt angle α is increased and an area of the top surface 1960 that is etched is decreased. This increases a peripheral range of etching and how the top surface 1960 of the substrate 1904 within the peripheral range is etched.

FIGS. 22A-22B show a collapsible edge ring assembly 2200 including a ring alignment and spacing element 2202 that is inner disposed and in a collapsed state in FIG. 22A and in an expanded state in FIG. 22B. The collapsible edge ring assembly 2200 may include edge rings 2210, 2212, 2214, 2216. The ring alignment and spacing element 2202 is "pyramid" shaped and tiered to include multiple levels 2217, 2219, 2221, 2223; each level for a respective one of the edge rings 2210, 2212, 2214, 2216. As the top edge ring 2210 is lifted, the ring alignment and spacing element 2202 expands, maintains alignment between the edge rings 2210, 2212, 2214, 2216, and lifts the edge rings 2210, 2212, 2214, 2216 successively.

As an example, the edge rings 2210, 2212, 2214, 2216 may have thicknesses T1-T4 and the tiers of the ring alignment and spacing element 2202 may have heights H1-H4. In one embodiment, the thicknesses T2-T4 are equal to each other. In another embodiment, the thicknesses T2-T4 are different. In yet another embodiment, the thickness T2-T4 increase in size from T2 to T4, such that T4>T3>T2. In an embodiment, the heights H1-H3 are equal to each other. The levels 2217, 2219, 2221, 2223 have widths W1, W2, W3, W4. The lower the level, the larger the width, such that W4>W3>W2>W1.

Figure 23B:
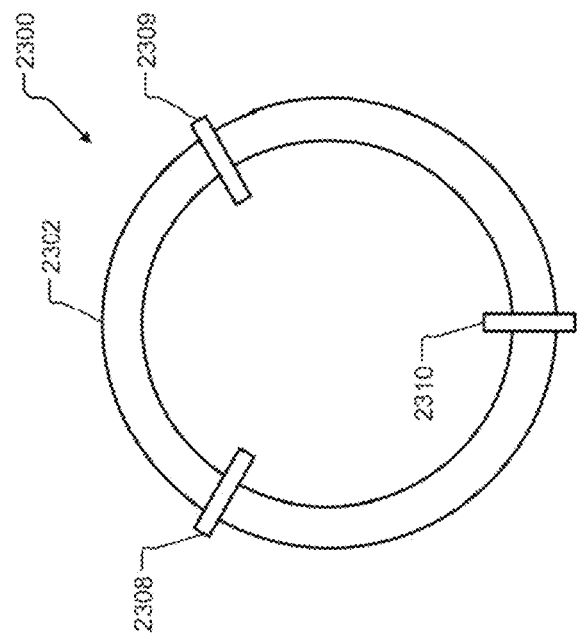
FIG. 23B is a bottom view of the collapsible edge ring assembly of FIG. 23A.
Figure 23A:
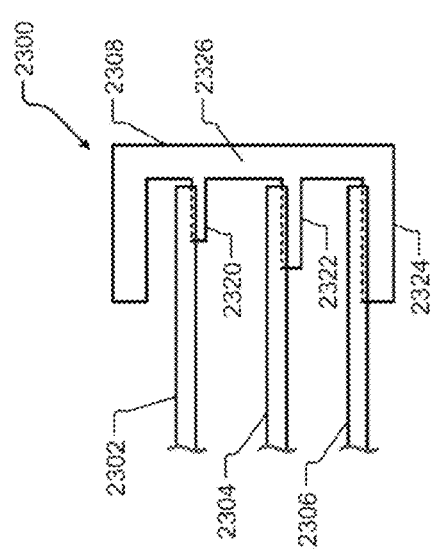
FIG. 23A is a cross-sectional side view of an example of a portion of another collapsible edge ring assembly including a ring alignment and spacing element in an expanded state in accordance with an embodiment of the present disclosure.

FIGS. 23A and 23B show a collapsible edge ring assembly 2300 including edge rings 2302, 2304, 2306 and ring alignment and spacing elements 2308, 2309, 2310 (the ring alignment and spacing element 2308 is shown in FIG. 1). The ring alignment and spacing element 2308 is shown in FIG. 23A in an expanded state. The ring alignment and spacing elements 2308, 2309, 2310 are located at a periphery of the edge rings 2302, 2304, 2306. Each of the ring alignment and spacing elements 2308, 2309, 2310 may be 'comb'-shaped and include fingers 2320, 2322, 2324 respectively for lifting the edge rings 2302, 2304, 2306. The fingers 2320, 2322, 2324 extend radially inward from a main member 2326. Although three edge rings and three fingers are shown for each ring alignment and spacing element, two or more edge rings and two or more fingers may be included. The fingers 2320, 2322, 2324 may be configured to interlock with, connect to, fit in notches of, and/or hold the respective edge rings 2302, 2304, 2306. Although not shown, a lift pin may extend through one or more of the edge rings (e.g., the edge rings 2304, 2306) and into a lift pin receiving element of an upper most edge ring (e.g., the edge ring 2302). The lift pin may directly lift the edge ring 2302 followed by indirectly lifting edge rings 2304, 2306 due to being held by, connected to, and/or sitting on the fingers 2320, 2322, 2324 of the ring alignment and spacing element 2308. The fingers 2320, 2322, 2324 may decrease in length from the uppermost finger 2320 to the bottom most finger 2324, such that the uppermost finger 2320 is shorter than the intermediate finger 2322, which is shorter than the bottom most finger 2324.

Figure 24:
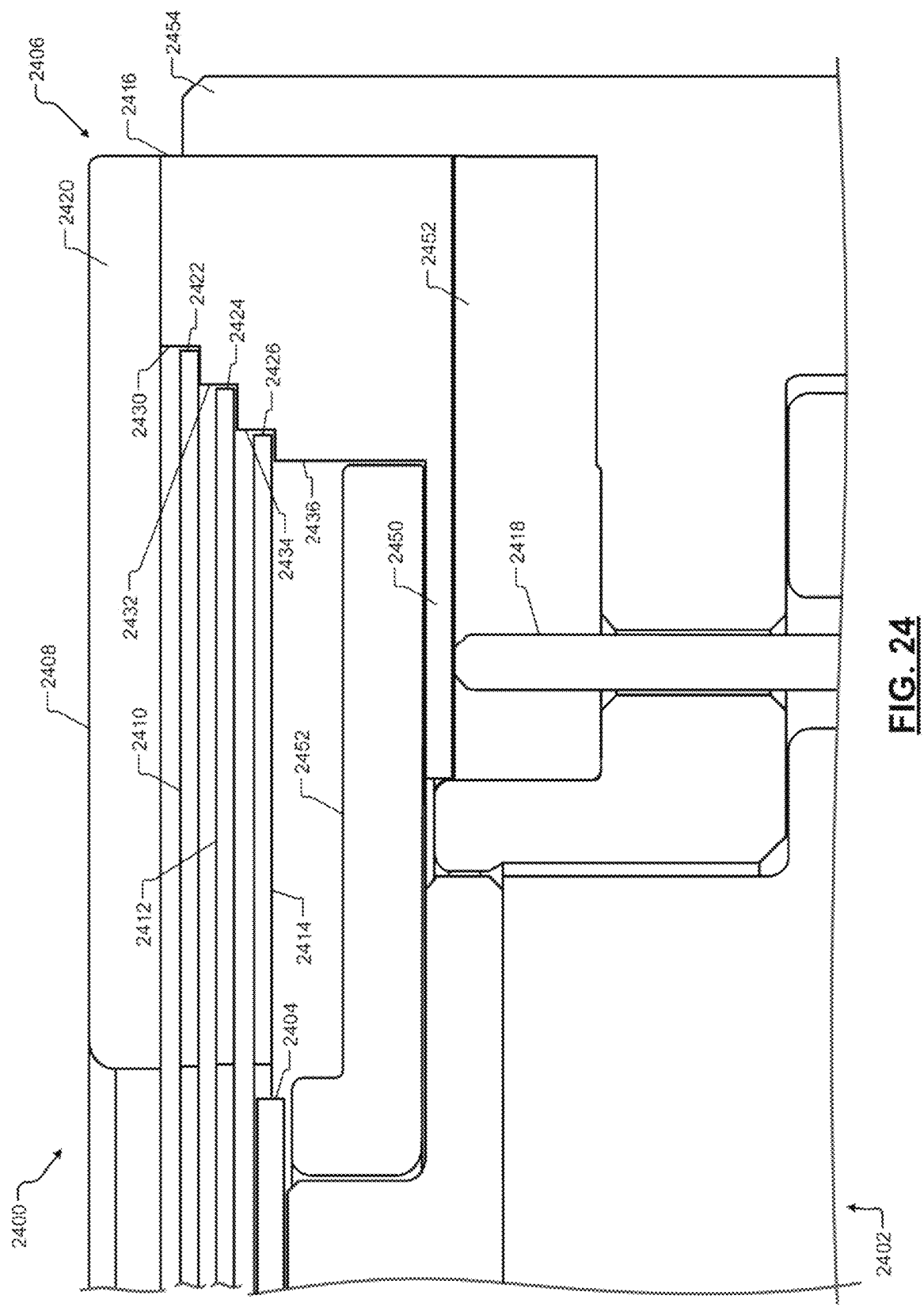
FIG. 24 is a cross-sectional side view of a portion of an edge ring system, a substrate support and a substrate illustrating an example of a collapsible edge ring assembly including edge rings lifted by a stepped outer ring in accordance with an embodiment of the present disclosure.

FIG. 24 shows an edge ring system 2400, a substrate support 2402 and a substrate 2404. The edge ring system 2400 includes a collapsible edge ring assembly 2406 that includes edge rings 2408, 2410, 2412, 2414 lifted by a stepped outer edge ring 2416, which may be referred to as a ring alignment and spacing element. A lift pin 2418 lifts the stepped outer edge ring 2416, which in turn lifts the edge rings 2408, 2410, 2412, 2414. Radial peripheral ends 2420, 2422, 2424, 2426 of the edge rings 2408, 2410, 2412, 2414 are disposed on steps 2430, 2432, 2434, 2436 of the stepped outer edge ring 2416. The lift pin 2418 may push upwards on a flange 2450 of the stepped outer edge ring 2416. The flange 2450 extends radially inward from the step 2436 and between an edge ring 2452 and the lift pin 2418. The edge ring 2452 is similar to the edge rings 310 and 1510 of FIGS. 3A and 15. Although not shown, the flange 2450 may include a lift pin receiving element to receive a top end of the lift pin 2418, as described above. The stepped outer edge ring 2416 may be included in a stack of edge rings as shown and be disposed on an intermediate edge ring 2452, which is disposed on a bottom edge ring 2454.

The stepped outer edge ring 2416 may be formed of a non-volatile material such as quartz. The intermediate edge ring 2452 may be formed of a volatile material such as sapphire. The bottom edge ring 2454 may be formed of a non-volatile material such as quartz.

Figure 25:
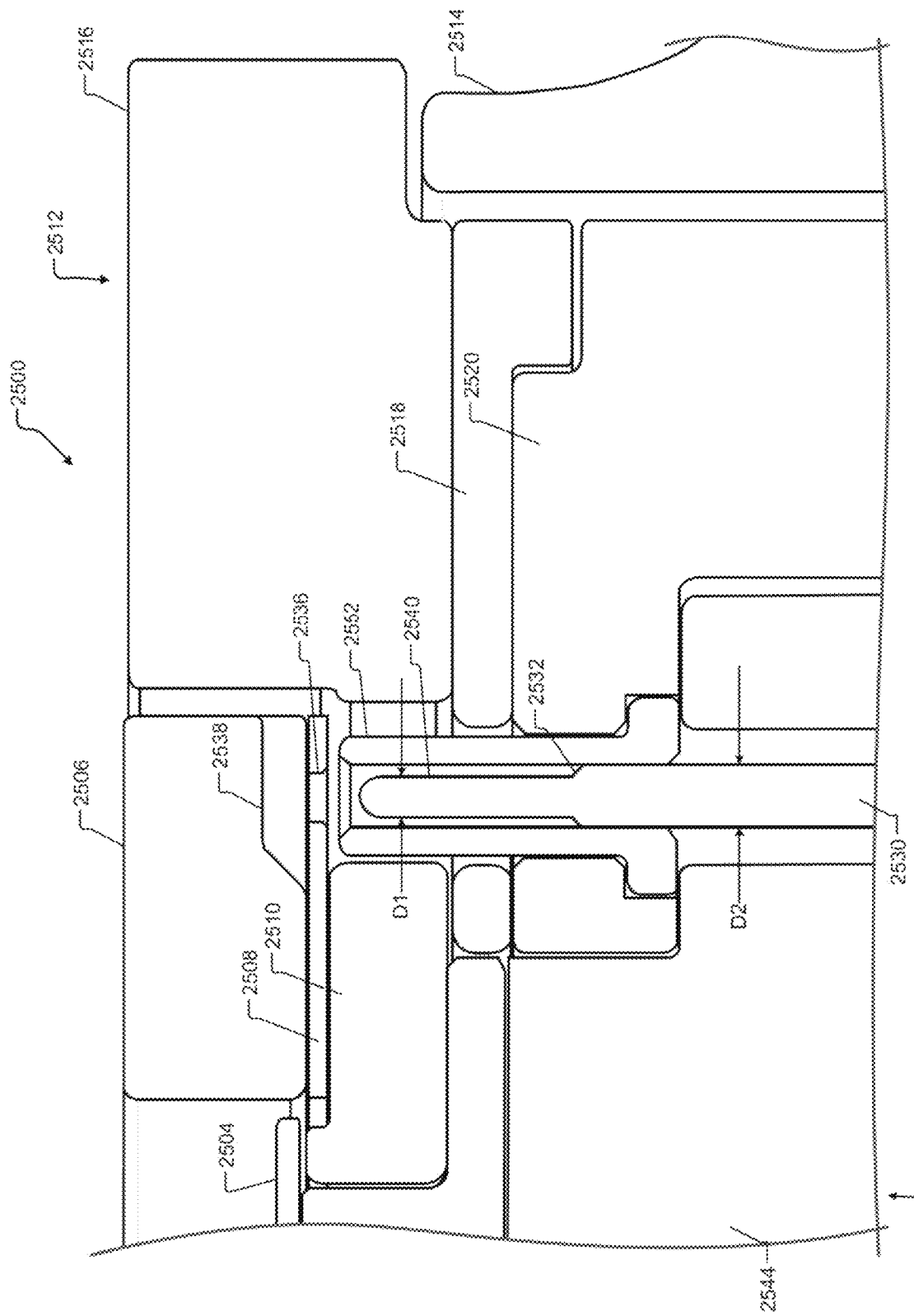
FIG. 25 is a cross-sectional side view of an example of an edge ring assembly, a substrate support and a substrate illustrating edge rings lifted by stepped lift pins in accordance with an embodiment of the present disclosure.

FIG. 25 shows an edge ring assembly 2500, a substrate support 2502 and a substrate 2504. The edge ring assembly 2500 includes a top edge ring 2506, an intermediate edge ring 2508, a stabilizing edge ring 2510, an edge ring stack 2512 and a liner 2514. The edge ring stack includes edge rings 2516, 2518, 2520, which are similar to edge rings 1520, 1522, 1524 of FIG. 15. The edge ring 2506 is similar to the edge ring 1508, but may be thinner than the edge ring 1508 due to the incorporation of the edge ring 2508.

The edge rings 2506, 2508 may be lifted by three or more lift pins (one lift pin 2530 is shown). The lift pins may each include one or more steps for lifting respectively one or more edge rings. For example, the lift pin 2530 is shown as including a step 2532, which is used to lift the edge ring 2508. A tip 2534 of the lift pin 2530 is moved through a hole 2536 in the edge ring 2508 and is received in a lift pin receiving element 2538. The lift pin 2530 includes a first portion 2540 having a first diameter D1 and a second portion 2542 having a second diameter D2, which is greater than D1. The lift pin 2530 may have any number of steps to lift any number of edge rings. This provides increased versatility and processing sensitivity by allowing various numbers of edge rings to be incorporated and lifted to respective predetermined heights. The lift pin 2530 may extend through a base plate 2544 and a shield 2552, which may be similar to the shield 1538 of FIG. 15.

As an alternative to the example shown in FIG. 25, multiple sets of lift pins may be used, where a first set of lift pins raise a first edge ring (e.g., the top edge ring 2506) and a second set of lift pins raise a second edge ring (e.g., the intermediate edge ring 2508). In this example, the second edge ring may have holes, similar to the holes 2536, for both of the sets of lift pins. The first set of lift pins may not raise the intermediate edge ring 2508 and/or one or more edge rings disposed below the top edge ring 2506. The second set of lift pins may not raise the top edge ring 2506. The second set of lift pins, depending if stepped, may raise one or more edge rings disposed below the intermediate edge ring 2508. Any number of sets of lift pins, edge rings, and corresponding sets of holes may be included. As another example, the one or more edge rings that are disposed below the top edge ring 2506 may include lift pin receiving elements for receiving a corresponding set of lift pins. As a result, kinematic coupling may be provided between each edge ring being lifted and a respective set of lift pins.

Figure 26:
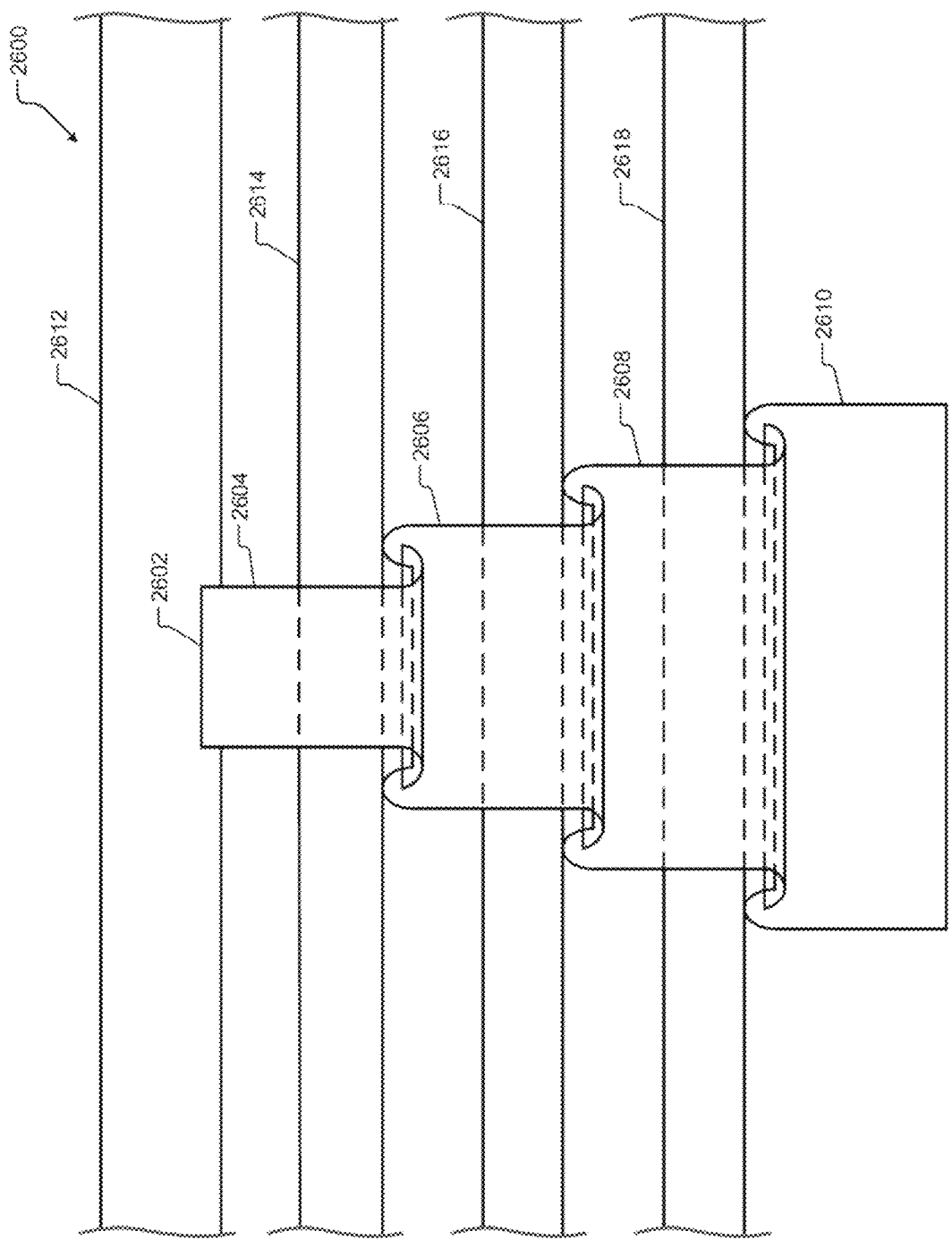
FIG. 26 is a cross-sectional side view of an example of a portion of another collapsible edge ring assembly including a ring alignment and spacing element with telescopic sections in accordance with an embodiment of the present disclosure.

FIG. 26 shows a collapsible edge ring assembly 2600 including a ring alignment and spacing element 2602 with telescopic sections 2604, 2606, 2608, 2610. Each of the telescopic sections 2604, 2606, 2608, 2610 may be used to attach to and/or lift a corresponding edge ring, such as edge rings 2612, 2614, 2616, 2618. The telescopic sections 2604, 2606, 2608 slide partially into the telescopic sections 2606, 2608, 2610, respectively. The telescopic sections 2604, 2606, 2608, 2610 are interlocking sections.

The examples disclosed herein have kinematic coupling and anti-walk features, as well as edge ring assemblies for increased tuning. The kinematic coupling disclosed herein may, as an example, maintain top edge ring positioning relative to a substrate to within 100 microns. The inclusion of kinematic coupling features improves positioning and centering of top edge rings by an order of 2 over traditional positioning and centering techniques. Inclusion of the 'V'-shaped grooves provides kinematic coupling without over-constraining an edge ring or binding an edge ring kit. As a result, a top edge ring does not need constellations to center and provide consistent alignment. The edge ring assemblies include edge rings that are actuated and lifted to physically manipulate plasma by adjusting tilt angles of a plasma sheath over top surfaces of a substrate, which in turn affects critical dimensioning and etch rates of the substrate.

Designing edge rings for higher radio frequency (RF) and direct current (DC) power levels can require a thorough mapping of datums and relative offsets to calculate each dimension and associated gap between components to avoid over constraining while minimizing sizes of the gaps (see Paschen's Law). To improve on extreme edge (EE) uniformity of a wafer, edge rings are lifted as disclosed herein and have an increased amount of tuning range. The effective pocket height may be varied within a single process of the wafer. The edge rings may be actuated gradually over time for wafers including memory components to compensate for erosion such that a single edge ring kit is able to maintain a predetermined level of EE uniformity for increased mean time between cleans (MTBCs). This reduces costs of operation.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A first edge ring for a substrate support, the first edge ring comprising:
   an annular-shaped body sized and shaped to surround an upper portion of the substrate support, wherein the annular-shaped body of the first edge ring defines
      an upper surface,
      a lower surface,
      a radially inner surface, and
      a radially outer surface; and
   three 'V'-shaped grooves disposed along the lower surface of the annular-shaped body to receive and provide kinematic coupling with top ends respectively of three lift pins, wherein each of the three 'V'-shaped grooves extends radially relative to a center of the annular-shaped body, and wherein a cross-section taken annularly through each of the three 'V'-shaped grooves is V-shaped.

2. The first edge ring of claim 1, wherein each of the three 'V'-shaped grooves contacts a respective one of the three lift pins at only two points at a time.

3. The first edge ring of claim 1, wherein the annular-shaped body comprises only three 'V'-shaped grooves.

4. The first edge ring of claim 1, wherein:
   each of the three 'V'-shaped grooves contacts a respective one of the three lift pins at only two points at a time; and
   the annular-shaped body comprises only three 'V'-shaped grooves.

5. The first edge ring of claim 1, wherein:
   the annular-shaped body comprises an inner diameter; and
   the inner diameter is greater than an outer diameter of a top portion of the substrate support.

6. The first edge ring of claim 1, wherein the annular-shaped body is formed at least partially of a non-volatile material.

7. The first edge ring of claim 1, wherein the three 'V'-shaped grooves comprises walls at 60-120° relative to each other.

8. The first edge ring of claim 1, wherein the three 'V'-shaped grooves comprises walls at 45° relative to each other.

9. The first edge ring of claim 1, wherein:
   the three 'V'-shaped grooves comprise at least one groove with a rounded vertex portion; and
   the rounded vertex portion has a radius between 0.018" and 0.035".

10. The first edge ring of claim 1, wherein the three 'V'-shaped grooves include at least one of a rounded groove, a groove with half conically shaped ends, or a groove with quarter hemi-spherically shaped ends.

11. The first edge ring of claim 1, wherein the three 'V'-shaped grooves include beveled edges.

12. The first edge ring of claim 1, wherein each of the three 'V'-shaped grooves includes a beveled portion to guide a respective one of the three lift pins into the corresponding one of the three 'V'-shaped grooves.

13. The first edge ring of claim 1, wherein the three 'V'-shaped grooves include at least one groove with parallel side walls and a flat or rounded top wall.

14. The first edge ring of claim 1, wherein the three 'V'-shaped grooves include at least one notch disposed at a bottom periphery of the annular-shaped body.

15. The first edge ring of claim 14, wherein the at least one notch includes:
   a half conically shaped end; or
   a quarter hemi-spherically shaped end.

16. The first edge ring of claim 1, wherein the three 'V'-shaped grooves are spaced 120° apart relative to a center of the annular-shaped body.

17. The first edge ring of claim 1, wherein each of the three 'V'-shaped grooves is shaped such that the corresponding one of the three lift pins does not contact an uppermost portion or a vertex portion of the corresponding one of the three 'V'-shaped grooves.

18. The first edge ring of claim 1, wherein inner wall surfaces of each of the three 'V'-shaped grooves are flat and arranged such that each of the inner wall surfaces contacts only one point at a time of a corresponding one of the three lift pins.

19. The first edge ring of claim 1, wherein the annular-shaped body is sized and shaped to move independently from the substrate support.

20. The first edge ring of claim 1, wherein the annular-shaped body is sized and shaped to be isolated from a substrate support plate of the substrate support.

21. The first edge ring of claim 1, wherein the radially inner surface is sized and shaped to surround an outer peripheral edge of a substrate support plate of the substrate support.

22. A system comprising:
   a first edge ring for a substrate support, the first edge ring comprising
   an annular-shaped body sized and shaped to surround an upper portion of the substrate support, wherein the annular-shaped body of the first edge ring defines
      an upper surface,
      a lower surface,
      a radially inner surface, and
      a radially outer surface; and three 'V'-shaped grooves disposed along the lower surface of the annular-shaped body to receive and provide kinematic coupling with top ends respectively of three lift pins, wherein each of the three 'V'-shaped grooves extends radially relative to a center of the annular-shaped body; and the three lift pins.

23. The system of claim 22, wherein a ratio of a depth of each of the three 'V'-shaped grooves and a diameter of a respective one of the three lift pins is 1:1.

24. The system of claim 23, wherein a ratio between a depth of each of the three 'V'-shaped grooves and a diameter of a respective one of the three lift pins is between 10:1 and 1:8.

25. The system of claim 22, wherein a ratio between a width of the one of the three 'V'-shaped grooves and a diameter of a respective one of the three lift pins is between 20:1 and 1:4.

26. The system of claim 22, wherein each of the three lift pins is shaped to contact two points on surfaces of a respective one of the three 'V'-shaped grooves at a time and not contact a top surface or vertex portion of the respective one of the three 'V'-shaped grooves.

27. The system of claim 22, wherein the three lift pins are formed at least partially of a volatile material.

28. The system of claim 22, further comprising:
at least one actuator for moving the three lift pins; and
a controller configured to control operation of the at least one actuator.

29. The system of claim 22, further comprising:
a second edge ring; and
at least one stabilizing element disposed in at least one pocket of the annular-shaped body and applying pressure on the second edge ring.

30. The system of claim 22, further comprising:
a second edge ring; and
a third edge ring,
wherein the first edge ring, the second edge ring and the third edge ring are arranged in a stack.

31. The system of claim 30, wherein the second edge ring and the third edge ring are each formed at least partially of a volatile material.

32. The system of claim 22, further comprising a second edge ring comprising a first top surface and a second top surface, wherein:
the first top surface is disposed adjacent a top surface of the substrate support and below a periphery of a substrate, wherein the first top surface is disposed (i) at a level higher than a level of a bottom surface of the first edge ring, and (ii) radially inside the first edge ring;
the second top surface is disposed below a portion of the first edge ring, the second top surface is disposed at a level lower than the level of the bottom surface of the first edge ring; and
an instep from the first top surface to the second top surface.

33. The system of claim 32, wherein the second edge ring is formed at least partially of a volatile material.

34. The system of claim 22, wherein a top end of each of the three lift pins is shaped such that only two points and no other portion of that lift pin contacts a respective one of the three 'V'-shaped grooves.

35. The system of claim 22, wherein inner wall surfaces of each of the three 'V'-shaped grooves are flat and arranged such that each of the inner wall surfaces contacts only one point at a time of a corresponding one of the three lift pins.

36. A system comprising:
a first edge ring for a substrate support, the first edge ring comprising
an annular-shaped body sized and shaped to surround an upper portion of the substrate support, wherein the annular-shaped body of the first edge ring defines
an upper surface,
a lower surface,
a radially inner surface, and
a radially outer surface; and
three 'V'-shaped grooves disposed along the lower surface of the annular-shaped body to receive and provide kinematic coupling with top ends respectively of three lift pins, wherein each of the three 'V'-shaped grooves extends radially relative to a center of the annular-shaped body; and
the substrate support comprising a substrate support plate,
wherein at least one of the annular-shaped body is sized and shaped to move independently from the substrate support, the annular-shaped body is sized and shaped to be isolated from the substrate support plate, and the radially inner surface is sized and shaped to surround an outer peripheral edge of the substrate support plate.

37. The system of claim 36, wherein:
the annular-shaped body is sized and shaped to move independently from the substrate support and to be isolated from the substrate support plate; and
the radially inner surface is sized and shaped to surround the outer peripheral edge of the substrate support plate.

38. The system of claim 36, further comprising:
the three lift pins;
at least one actuator for moving the three lift pins to move the first edge ring relative to the substrate support plate; and
a controller configured to control operation of the at least one actuator to independently move the first edge ring relative to the substrate support plate.

39. The system of claim 38, wherein the at least one actuator comprises a plurality of actuators configured to independently move the three lift pins.

40. The system of claim 36, wherein the substrate support plate is a top plate of the substrate support.

41. The system of claim 36, wherein the first edge ring is separate from and not in contact with the substrate support plate.

42. The first edge ring of claim 1, wherein the three 'V'-shaped grooves collectively contact the three lift pins at a total of only six points at a time to provide the kinematic coupling.

43. The first edge ring of claim 1, wherein the annular-shaped body comprises:
a top member having the upper surface; and
an outer flange extending downward from the top member and having the radially outer surface.

44. The first edge ring of claim 43, wherein:
the outer flange is configured to extend down along a radially outer surface of a second edge ring; and
the second edge ring supports the first edge ring.

45. The first edge ring of claim 44, wherein the outer flange protects upper portions of the three lift pins and a portion of the second edge ring from directly receiving and being in contact with plasma.

46. The first edge ring of claim 44, wherein;
the outer flange is configured to extend down along a portion of a third edge ring; and
the third edge ring supports the first edge ring.

47. The first edge ring of claim 46, wherein the outer flange protects an upper portion of the third edge ring from directly receiving and being in contact with plasma.

48. The first edge ring of claim 43, wherein:
the top member has the lower surface that is configured to be supported by a second edge ring; and
the outer flange has a second lower surface that is configured to be supported by a third edge ring.

49. The first edge ring of claim 43, wherein:
the top member has the lower surface that is configured to be supported by a second edge ring; and
the outer flange has a second lower surface that is configured to be adjacent to a third edge ring.

50. The first edge ring of claim 48, wherein the three lift pins extend through the second edge ring and the third edge ring and into the first edge ring.

51. The first edge ring of claim 44, wherein:
the annular-shaped body extends upward such that the upper surface of the annular-shaped body is vertically higher than a top surface of the substrate support;
the upper surface of the annular-shaped body extends over the three 'V'-shaped grooves; and
the flange of the annular-shaped body is adjacent an outer peripheral side surface of the second edge ring and is supported by a third edge ring.

* * * * *